US012677453B2

(12) United States Patent
Zhang et al.

(10) Patent No.: US 12,677,453 B2
(45) Date of Patent: Jul. 7, 2026

(54) FRONTSIDE ILD OPTIMIZATION FOR BACKSIDE POWER DISTRIBUTION NETWORK

(71) Applicant: International Business Machines Corporation, Armonk, NY (US)

(72) Inventors: Haojun Zhang, Schenectady, NY (US); Ruilong Xie, Niskayuna, NY (US); Oleg Gluschenkov, Tannersville, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 18/535,437

(22) Filed: Dec. 11, 2023

(65) Prior Publication Data

US 2025/0194183 A1     Jun. 12, 2025

(51) Int. Cl.
| | |
|---|---|
| *H10D 62/10* | (2025.01) |
| *H10D 62/13* | (2025.01) |
| *H10D 62/17* | (2025.01) |
| *H10D 84/85* | (2025.01) |
| *H10D 88/00* | (2025.01) |

(52) U.S. Cl.
CPC ......... *H10D 62/126* (2025.01); *H10D 62/121* (2025.01); *H10D 62/154* (2025.01); *H10D 62/158* (2025.01); *H10D 62/393* (2025.01); *H10D 84/853* (2025.01); *H10D 88/00* (2025.01)

(58) Field of Classification Search
CPC .. H10D 62/126; H10D 62/121; H10D 62/154; H10D 62/158; H10D 62/393; H10D 88/00; H10D 30/501; H10D 84/851; H10D 89/105; H10D 84/0186; H10D 84/85
See application file for complete search history.

(56) References Cited

U.S. PATENT DOCUMENTS

| | | |
|---|---|---|
| 11,355,410 B2 | 6/2022 | Huang et al. |
| 11,444,162 B2 | 9/2022 | Lee et al. |

(Continued)

FOREIGN PATENT DOCUMENTS

| | | |
|---|---|---|
| CN | 102487048 A | 6/2012 |
| DE | 102009047314 A1 | 6/2011 |

OTHER PUBLICATIONS

International Searching Authority, "Notification of Transmittal of the International Search Report and the Written Opinion of the International Searching Authority, or Declaration," Patent Cooperation Treaty May 8, 2025, 06 pages, International Application No. PCT/ IB2024/061916.

(Continued)

*Primary Examiner* — Fernando L Toledo
*Assistant Examiner* — Adam S Bowen
(74) *Attorney, Agent, or Firm* — Scully, Scott, Murphy & Presser, P.C.; L. Jeffrey Kelly, Esq.

(57)     ABSTRACT

A semiconductor structure containing optimized frontside interlayer dielectrics (ILDs) for a direct backside contact based backside power distribution network is provided. Notably, the frontside ILD materials that are present in the semiconductor structure are optimized such that a frontside ILD layer that is present on a critical circuit path has a thermal conductivity that is less than a thermal conductivity of a frontside ILD layer that is present on a non-circuit path.

20 Claims, 19 Drawing Sheets

(56)  References Cited

U.S. PATENT DOCUMENTS

| 11,545,491 | B2 | 1/2023 | Chiu et al. |
| 2002/0158337 | A1 | 10/2002 | Babich et al. |
| 2009/0072400 | A1 | 3/2009 | Zhu et al. |
| 2011/0309450 | A1* | 12/2011 | Shifren ................. H10D 84/85 |
| | | | 257/E21.632 |
| 2012/0306082 | A1 | 12/2012 | Sekar et al. |
| 2020/0168555 | A1 | 5/2020 | Huang et al. |
| 2021/0111115 | A1 | 4/2021 | Morrow et al. |
| 2021/0343578 | A1 | 11/2021 | Chang et al. |
| 2022/0037496 | A1 | 2/2022 | Chen et al. |
| 2022/0093448 | A1 | 3/2022 | Yu et al. |
| 2022/0302268 | A1 | 9/2022 | Chiang et al. |
| 2023/0071998 | A1 | 3/2023 | Wang et al. |
| 2023/0077243 | A1 | 3/2023 | Xie et al. |
| 2023/0086633 | A1 | 3/2023 | Frougier et al. |

OTHER PUBLICATIONS

Intellectual Property Office, Patents Act 1977: Examination Report under Section 18(3), Mar. 31, 2026, 06 Pages, GB Application No. 2603509.7.

* cited by examiner

FRONTSIDE ILD OPTIMIZATION FOR BACKSIDE POWER DISTRIBUTION NETWORK

BACKGROUND

The present application relates to semiconductor technology, and more particularly to a semiconductor structure containing optimized frontside interlayer dielectrics for a direct backside contact based backside power distribution network.

When forming a structure including a plurality of complementary metal oxide semiconductor (CMOS) devices, such as integrated circuits, standard cells may be used as a base unit for designing and manufacturing the integrated circuits. The standard cell(s) may be used to form one or more functional circuits, and each standard cell may have the same footprint (e.g., may have a standard footprint). Using standard cells when designing complex circuits and components reduces design and manufacture costs.

In use, each standard cell of a semiconductor device requires power input (Vdd) and ground (Vss) connections. To power the various components thereof, each standard cell is generally coupled to a power rail which is electrically connected to an active layer of the standard cell to provide the power (Vdd). In some instances, a plurality of power rails may be provided for each standard cell to respectively provide the power (Vdd) and the ground (Vss).

Conventional power rails are formed in the back-end-of-line (BEOL) levels. To improve the scaling and reduce the routing complexity of the signal lines, one method is to move the power rails away from BEOL and form them beneath the active semiconductor devices. One typical structure is a buried power rail, which is typically embedded in a shallow trench isolation structure of a semiconductor device. Another typical example is a backside power rail, which is formed after a wafer is flipped with a substrate thinning or removal.

SUMMARY

A semiconductor structure containing optimized frontside interlayer dielectrics (ILDs) for a direct backside contact based backside power distribution network is provided. Notably, the frontside ILD materials that are present in the semiconductor structure are optimized such that a frontside ILD layer that is present on a critical circuit path has a thermal conductivity that is less than a thermal conductivity of a frontside ILD layer that is present on a non-critical circuit path.

In one aspect of the present application, a semiconductor structure is provided. In some embodiments, the semiconductor structure includes a first region including a first pair of complementary transistors. The structure further includes a second region adjacent to the first region, wherein the second region includes a second pair of complementary transistors. The structure even further includes a first frontside ILD layer having a first thermal conductivity present in the second region, and a second frontside ILD layer having a second thermal conductivity present in the first region, wherein the second thermal conductivity is less than the first thermal conductivity.

DETAILED DESCRIPTION

Figure 1:
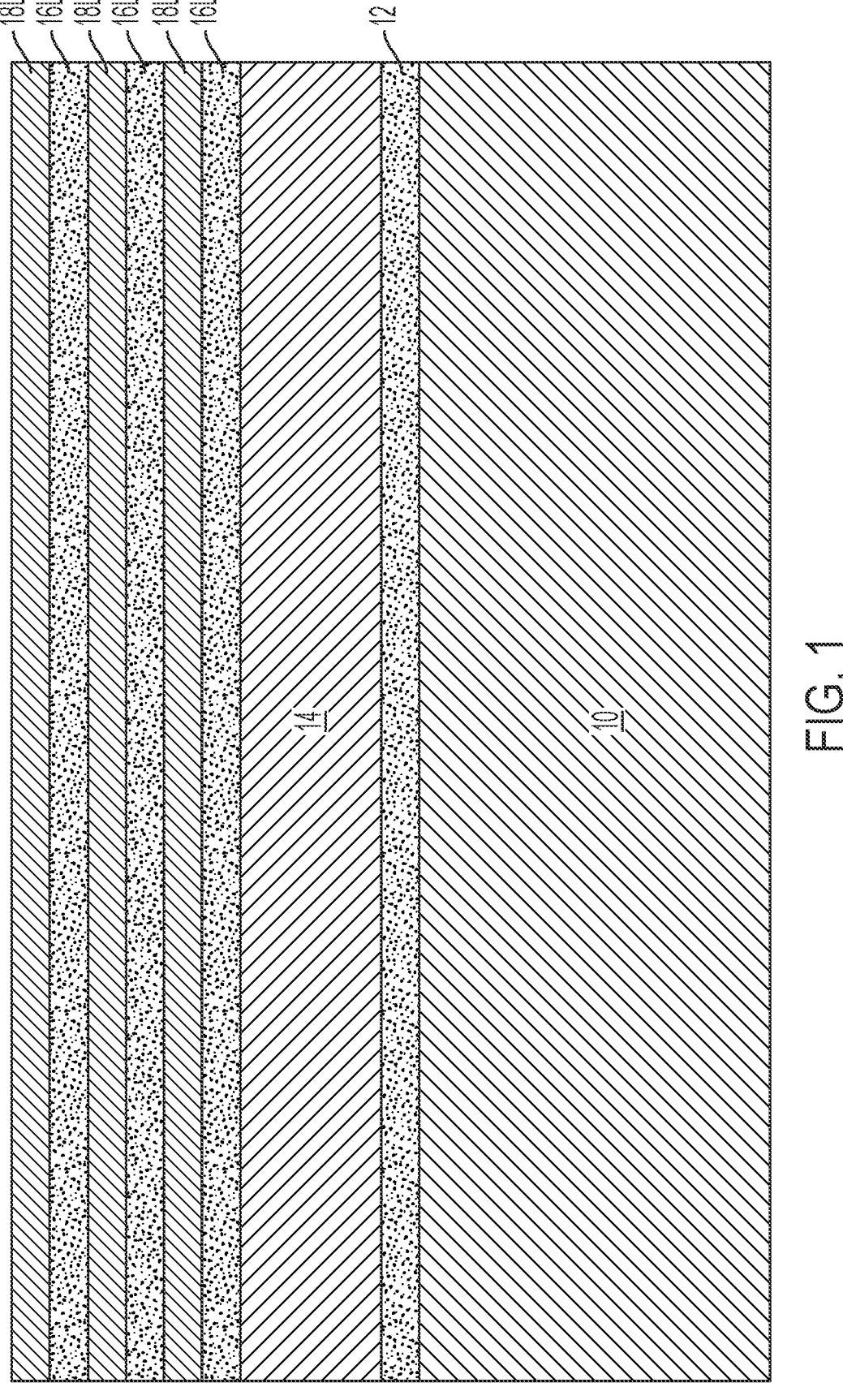
FIG. 1 is a cross sectional view of an exemplary semiconductor structure that can be employed in accordance with an embodiment of the present application, the exemplary semiconductor structure including a material stack of alternating sacrificial semiconductor material layers and semiconductor channel material layers located on substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

During backside processing of a semiconductor structure including transistors, backside ion implantation and laser annealing is typically performed to re-introduce dopants into the source/drain regions and to diffuse and activate those implanted dopants. During the laser anneal, the heat that is generated can dissipate from the backside of the structure to the frontside of the structure and can negatively impact (i.e., resistance degradation and reliability degradation such as, for example, electromigration and time dependent dielectric breakdown (TDDB)) the electrically conductive metal lines M1 that are present in the frontside of the structure. In cases in which a silicon dioxide frontside ILD layer is employed throughout the entirety of the structure, this laser anneal can cause major thermal dissipation which can lead to resistance degradation and reliability concerns of the electrically conductive metal lines M1 that are present in the frontside of the structure. Such resistance degradation and reliability concerns can be acceptable for non-critical circuit paths, but is not tolerable for critical circuit paths. Throughout the present application, the term "critical circuit path" denotes an area including fin pitch and minimum metal line width (mostly for signal lines). Throughout the present application, the term "non-critical circuit path" denotes an area including relaxed pitch and wide metal lines. A solution to this problem is required to avoid performance degradation (resistance increase) or reliability degradation (shorter electromigration lifetime and lower TDDB voltage).

In the present application, the above problem is solved by optimizing the frontside ILD materials such that a frontside ILD layer that is present on a critical circuit path has a thermal conductivity that is less than a thermal conductivity of a frontside ILD layer that is present on a non-critical circuit path. In the illustrated embodiment, each of the critical and non-critical circuit paths includes a plurality of transistors that which can be arranged as CMOS cells.

In the present application, each CMOS cell includes a complementary and symmetrical pair of p-type FETs (PFETs) and n-type FETS (NFETs) for logic functions. CMOS technology can be used for constructing integrated circuit (IC) chips, including microprocessors, microcontrollers, memory chips and other digital logic circuits. CMOS technology can also be used for analog circuits such as image sensors, data converters, RF circuits and highly integrated transceivers for many types of communication.

A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. In the embodiment described in the present application, the transistor is a nanosheet transistor. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets. Nanosheet transistors provide considerable scaling with high drive current capability. Nanosheet transistors provide a larger drive current for a given footprint compared to finFET technology. Although nanosheet transistors are described in this application, this application is not limited to nanosheet transistors. Instead, the present application can be used for finFETs, nanowire FETs, planar FETs, stacked FETs or any combination of such FETs including nanosheet transistors.

In the present application, the semiconductor structure includes a frontside and a backside. The frontside includes a side of the structure that includes at least one nanosheet transistor, frontside contact structures, and a frontside BEOL structure. The backside of the semiconductor structure is the side of the structure that is opposite the frontside. The backside includes a backside contact structure, and a backside interconnect structure.

Figure 16:
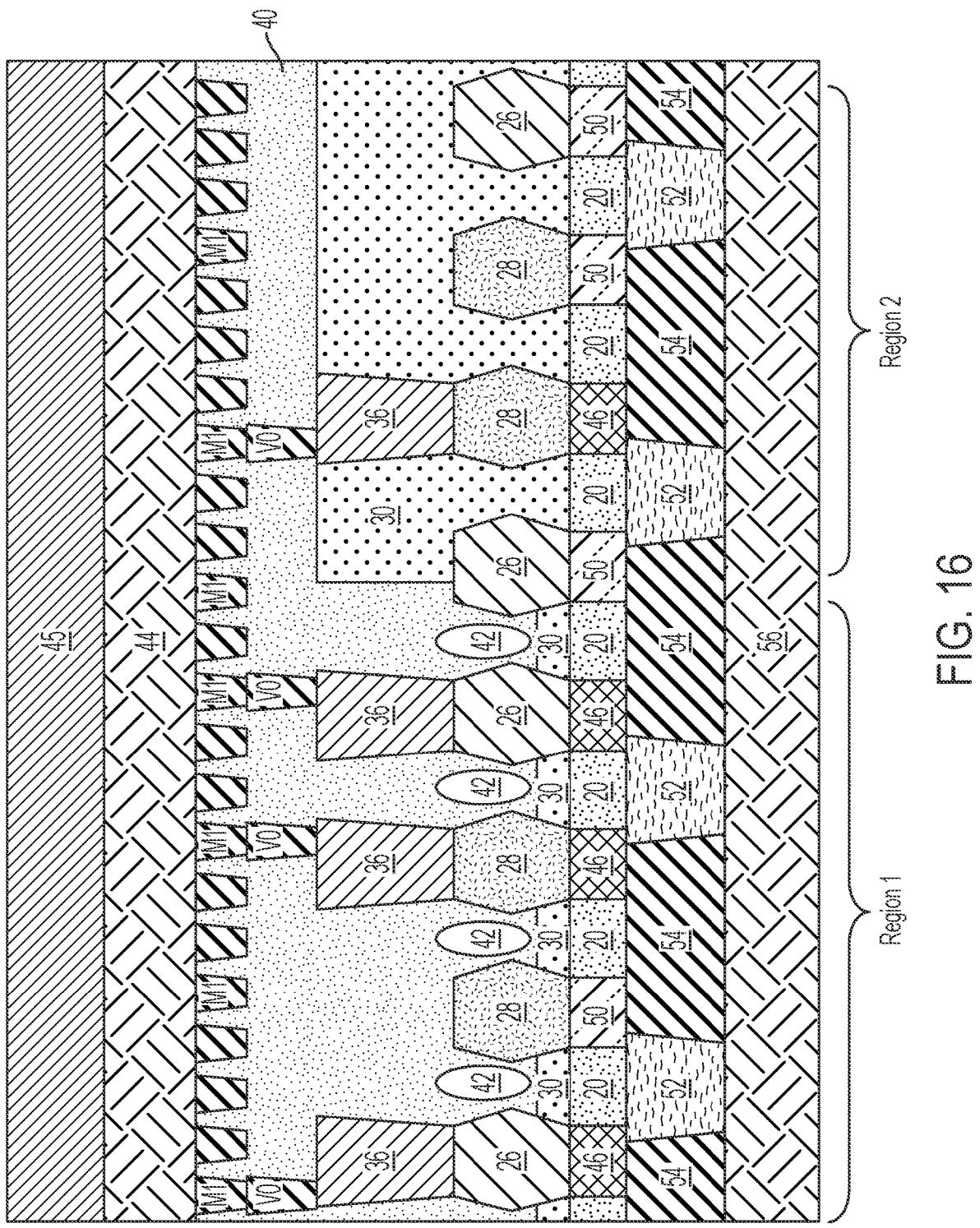
FIG. 16 is a cross sectional view of the exemplary semiconductor structure shown in FIG. 15 after forming backside power rails, and forming a backside interconnect structure.

In embodiments and as illustrated in FIG. 16, the semiconductor structure includes a first region, Region 1, (i.e., left hand side of FIG. 16) including a first pair of complementary transistors. The structure further includes a second region, Region 2, (i.e., right hand side of FIG. 16) adjacent to the first region, wherein the second region includes a second pair of complementary transistors. The structure even further includes a first frontside ILD layer 30 having a first thermal conductivity present in the second region, and a second frontside ILD layer 40 having a second thermal conductivity present in the first region, wherein the second thermal conductivity is less than the first thermal conductivity. During a backside laser anneal process (or other like thermal processing step), the heat that is generated can dissipate from the backside of the structure to the frontside of the structure and can negatively impact (i.e., resistance degradation and reliability degradation) the electrically conductive metal lines M1. Since the second frontside ILD layer 40 has a low thermal conductivity, any heat that is caused during backside processing will not readily dissipate through the second frontside ILD layer 40 (this can cause a big delta temperature between the anneal region to the M1 lines). In contrast, and since the first frontside ILD layer 30 has a high thermal conductivity, any heat that is caused during backside processing can easily dissipate through the first frontside ILD layer 30 at a faster rate than through the second frontside ILD layer 40 (this also helps to bypass heat or force heat to go through the first frontside ILD layer 30 that is present on non-critical critical path (i.e., left hand side of FIG. 16)). Note that although the first and second regions can both include a first frontside ILD layer 30 and a second frontside ILD layer 40 as shown in FIG. 16, the first region includes the second frontside ILD layer 40 as the majority (greater than 50% and more typically greater than 70%) frontside ILD layer, while the second region includes the first frontside ILD layer 40 as the majority frontside ILD layer.

In embodiments of the present application, the first region defines a critical circuit path, and the second region defines a non-critical circuit path.

In some embodiments (as depicted in FIG. 16), a portion of the second frontside ILD layer 40 is present in the second region and is located on top of the first frontside ILD layer 30. The portion of the second frontside ILD layer 40 that is present in the second region can be compositionally the same as, or compositionally different from, the entirety of the second frontside ILD layer 40 present in the first region.

In embodiments of the present disclosure and as illustrated in FIG. 16, a portion of the first frontside ILD layer 30 is present in the first region beneath the second frontside ILD layer 40 and adjacent to a neighboring pair of source/drain regions 26, 28 of the first pair of complementary transistors.

In embodiments of the present application and as illustrated in FIG. 16, air gap 42 is located in the second frontside ILD layer 40 that is in the first region, wherein the air gap 42 is adjacent to a neighboring pair of source/drain regions 26, 28 of the first pair of complementary transistors. The air gap 42 is also a low thermal conductivity dielectric that can provide the same benefit as mentioned above for the second frontside ILD layer 40. The inclusion of the air gap 42 with the second frontside ILD layer 40 provides greater thermal dissipation, than the case without the air gap 42 present.

In embodiments of the present application and as illustrated in FIG. 16, a portion of the first frontside ILD layer 30 is present in the first region beneath the second frontside ILD layer 40 and the air gap 42.

In embodiments of the present application and as illustrated in FIG. 16, the structure can further include electrically conductive metal lines M1 (also simply referred to as metal lines M1) present in both the first region and the second region.

In embodiments of the present application and as illustrated in FIG. 16, each metal line M1 present in the first region (of lower thermal conductivity) has a higher line resistance than each metal line M1 present in the second region (higher thermal conductivity and lower resistance). The difference is metal line resistance is due to the type of frontside ILD material that is present in each of the regions.

In embodiments of the present application and as illustrated in FIG. 16, the structure further includes a frontside BEOL structure 44 located on the second frontside ILD layer 40 and contacting each of the metal lines M1 present in the first region and the second region.

In embodiments of the present application and as illustrated in FIG. 16, at least one of the electrically conductive metal lines M1 (far left hand side of the drawing) in the first region is electrically connected to a source/drain region (i.e., first source/drain region 26) of a first transistor of the first pair of complementary transistors through an electrically conductive via V0 and a frontside source/drain contact structure 36.

In embodiments of the present application and as illustrated in FIG. 16, the electrically conductive via V0 and the frontside source/drain contact structure 36 are both embedded in the second frontside ILD layer 40.

In embodiments of the present application and as illustrated in FIG. 16, the structure further includes backside power rail 54 located beneath the first region, wherein the backside power rail 54 is electrically connected to a source/drain region (i.e., second source/drain region 28) of a second transistor of the first pair of complementary transistors via a backside source/drain contact structure 50.

In embodiments of the present application and as illustrated in FIG. 16, the structure can further include a backside interconnect structure 56 contacting the backside power rail 54.

In embodiments of the present application and as illustrated in FIG. 16, at least one other electrically conductive metal line M1 in the first region is electrically connected to a source/drain region (i.e., second source/drain region 28) of a second transistor of the first pair of complementary transistors through another electrically conductive via V0 and another frontside source/drain contact structure 36.

In embodiments of the present application and as illustrated in FIG. 16, at least one of the electrically conductive metal lines M1 in the second region is electrically connected to a source/drain region of a first transistor of the second pair of complementary transistors through an electrically conductive via V0 and a frontside source/drain contact structure 36.

In embodiments of the present application and as illustrated in FIG. 16, the frontside source/drain contact structure 36 is embedded in the first frontside ILD layer 30 and the electrically conductive via V0 is embedded in the second frontside ILD layer 40.

In embodiments of the present application and as illustrated in FIG. 16, the structure can further include a backside power rail 54 located beneath the second region, wherein the backside power rail is electrically connected to a source/drain region of a second transistor of the second pair of complementary transistors via a backside source/drain contact structure 36.

In embodiments of the present application and as illustrated in FIG. 16, the structure can further include a backside interconnect structure 56 contacting the backside power rail 54.

In embodiments of the present application and as illustrated in FIG. 16, the structure can further include a pair of backside power rails 54 located beneath the second region, wherein one of backside power rail of the pair of electrically conductive power rails is electrically connected to a source/drain region of a first transistor of the second pair of complementary transistors via a backside source/drain contact structure and the other of the backside power rails of the pair of electrically conductive power rails is electrically connected to a source/drain region of a second transistor of the second pair of complementary transistors via another backside source/drain contact structure 36.

In embodiments of the present application and as illustrated in FIG. 16, the first thermal conductivity of the first frontside ILD layer 30 is 1 W/(m*K) or greater (typically 3 W/(m*K) or greater), and the second thermal conductivity of the second frontside ILD layer 40 is less than 0.3 W/(m*K).

These and other aspects of the present application, including processing steps that can be used in forming the structure of the present application will now be described in greater detail. Referring first to FIG. 1, there is illustrated an exemplary semiconductor structure that can be employed in accordance with an embodiment of the present application. The exemplary semiconductor structure includes a material stack of alternating sacrificial semiconductor material layers 16L and semiconductor channel material layers 18L located on substrate.

In the present application, the substrate can include a first semiconductor layer 10, an etch stop layer 12 and a second semiconductor layer 14. In embodiments, the first semiconductor layer 10 and/or the etch stop layer 12 can be omitted from the substrate. The first semiconductor layer 10 is composed of a first semiconductor material, and the second semiconductor layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the second semiconductor layer 14 can be compositionally the same as, or compositionally different from, the first semiconductor material that provides the first semiconductor layer 10.

In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the first semiconductor material that provides the first semiconductor layer 10 and the second semiconductor material that provides the second semiconductor layer 14. In one example, the first semiconductor layer 10 is composed of silicon, the etch stop layer 12 is composed of silicon dioxide, and the second semiconductor layer 14 is composed of silicon. In another example, the first semiconductor layer 10 is composed of silicon, the etch stop layer 12 is composed of silicon germanium, and the second semiconductor layer 14 is composed of silicon.

The substrate including the first semiconductor layer 10, the etch stop layer 12 and the second semiconductor layer 14 can be formed utilizing techniques well known to those skilled in the art. For example, the substrate including the first semiconductor layer 10, the etch stop layer 12 and the second semiconductor layer 14 can be formed by a separation by ion implantation of oxygen process, or wafer bonding. Alternatively, the substrate including the first semiconductor layer 10, the etch stop layer 12 and the second semiconductor layer 14 can be formed by deposition of the various substrate layers one on top the other. The deposition used in forming the various substrate layers can include, but is not limited to, chemical vapor deposition (CVD), plasma enhanced chemical vapor deposition (PECVD), or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

As mentioned above, the material stack includes alternating sacrificial semiconductor material layers 16L and semiconductor channel material layers 18L. In some embodiments and as is illustrated in FIG. 1, the material stack can include 'n' number of semiconductor channel material layers 18L and 'n' number of sacrificial semiconductor material layers 16L, wherein n is an integer starting from one, typically n is 2 or greater. By way of one example, the material stack can include three sacrificial semiconductor material layers 16L and three semiconductor channel material layers 18L. In other embodiments not shown, the material stack can include 'm' number of semiconductor channel material layers 18L and 'm+1' number of sacrificial semiconductor material layers 16L, wherein m is an integer starting from one, typically m is 2 or greater. In such embodiments, each semiconductor channel material layer 18L would be sandwiched between a bottom sacrificial semiconductor material layer and a top sacrificial semiconductor material layer. Each sacrificial semiconductor material layer 16L is composed of a third semiconductor material, while each semiconductor channel material layer 18L is composed of a fourth semiconductor material that is compositionally different from the third semiconductor material. In some embodiments, the fourth semiconductor material that provides each semiconductor channel material layer 18L can provide high channel mobility for n-type FET devices (i.e., NFETs). In other embodiments, the fourth semiconductor material that provides each semiconductor channel material layer 18L can provide high channel mobility for p-type FET devices (PFETs). The third semiconductor material that provides each sacrificial semiconductor material layer 16L, and the fourth semiconductor material that provides each semiconductor channel material layer 18L can include one of the semiconductor materials mentioned above. In one example, the third semiconductor material that provides each sacrificial semiconductor material layer 16L is composed of a silicon germanium alloy having a germanium content from 20 atomic percent to 40 atomic percent and the fourth semiconductor material that provides each semiconductor channel material layer 18L is composed of silicon. Other combinations of semiconductor materials are possible as long as the third semiconductor material that provides each sacrificial semiconductor material layer 16L is compositionally different from the fourth semiconductor material that provides each semiconductor channel material layer 18L. The material stack including the alternating sacrificial semiconductor material layers 16L and semiconductor channel material layers 18L can be formed by CVD, PECVD, epitaxial growth or any combination of such deposition processes.

Figure 2A:
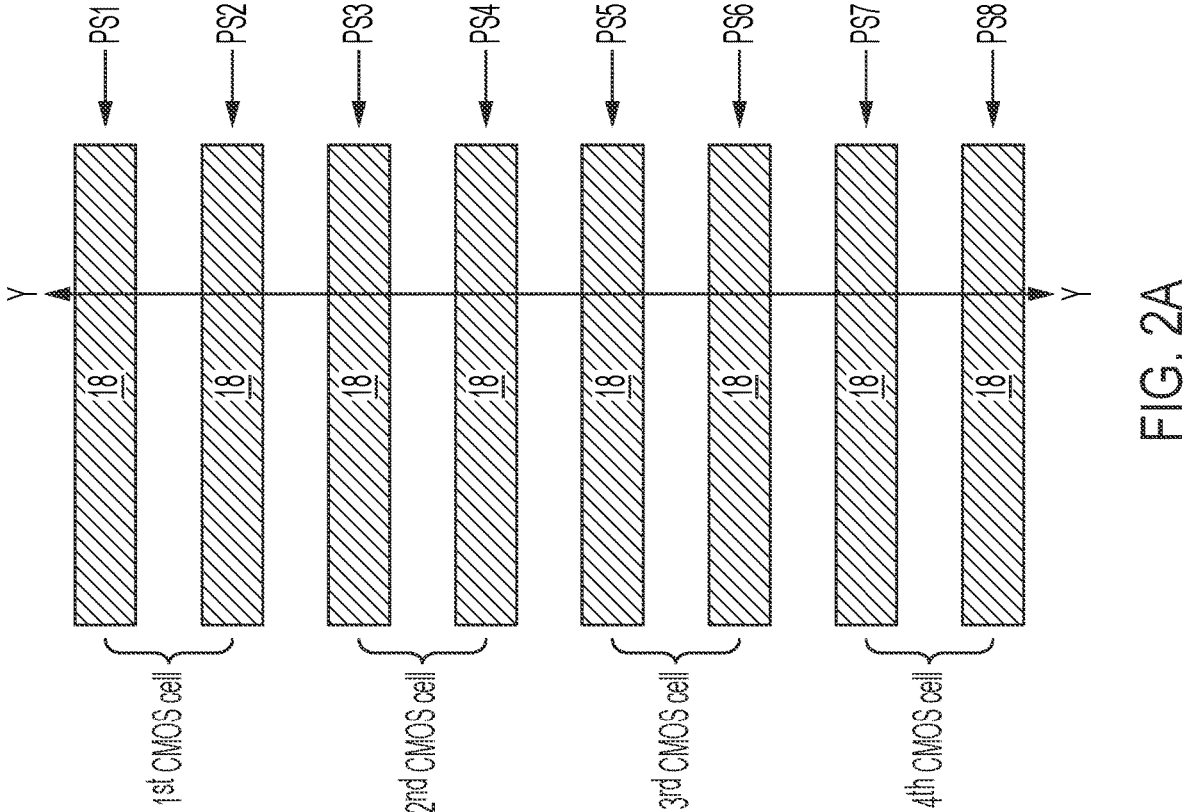
FIG. 2A is a top down view of the exemplary semiconductor structure shown in FIG. 1 after active device area patterning and shallow trench isolation structure formation.
Figure 2B:
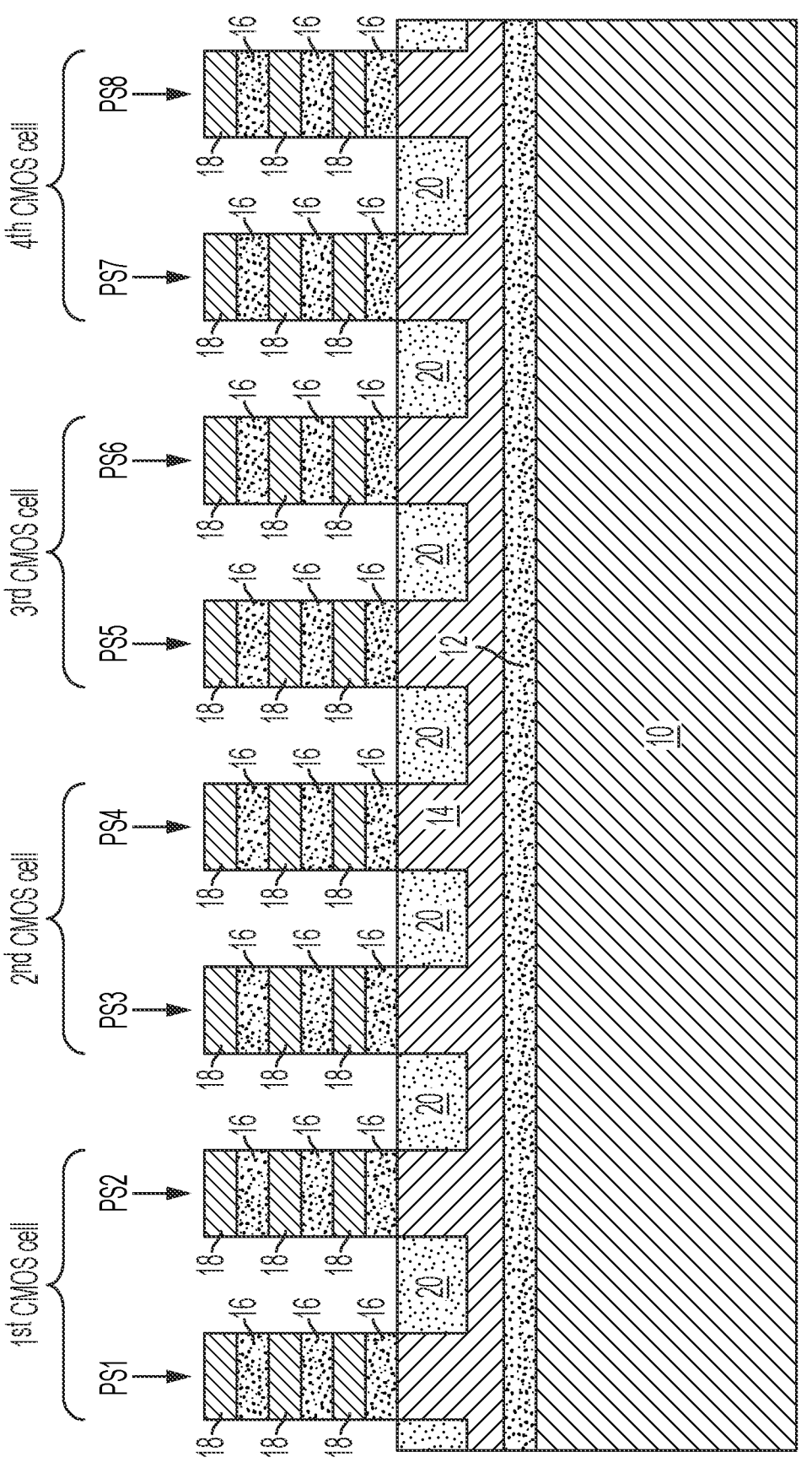
FIG. 2B is a cross sectional view of the exemplary semiconductor structure shown along cut Y-Y shown in FIG. 2A.

Referring now to FIGS. 2A-2B, there are illustrated the exemplary semiconductor structure shown in FIG. 1 after active device area patterning and shallow trench isolation structure 20 formation. It is noted the shallow trench isolation structures 20 are not illustrated in the top down view for clarity; the location of the shallow trench isolation structures 20 would be located between each of the rows of patterned material stacks. It is further noted that cut Y-Y is in a region in which various source/drain structures of the nanosheet transistors will be formed. The active device patterning includes lithography and etching. Lithography includes forming a photoresist material on a layer or stack of material layers that need to be patterned, exposing the photoresist material to a desired pattern of irradiation and thereafter developing the exposed photoresist material utilizing a conventional resist developer. The developed photoresist material has a desired pattern that is then transferred to the layer or stack of material layers that need to be patterned by etching. Etching can include dry etching and/or chemical wet etching. In some embodiments, a dry etch such as, for example, reactive ion etching (RIE), ion beam etching (IBE), plasma etching or any combination thereof can be used to transfer the pattern to the layer or stack of material layers that need to be patterned. In illustrated embodiment, this etch etches through an entirety of the material stack and stops on a surface of the second semiconductor layer 14. In embodiments, this etch can remove a portion of the second semiconductor layer 14. The developed photoresist material can be removed any time after etching (including an initial etch or the entirety of the etch) utilizing a conventional photoresist removal process.

This active device area patterning process defines the active areas of the structure. Each of the active areas that are formed includes a patterned material stack. Each patterned material stack includes remaining, i.e., non-etched, portions of the sacrificial semiconductor layers 16L and remaining, i.e., non-etched, portions of the semiconductor channel material layers 18L. Each remaining portion of the sacrificial semiconductor material layers 16L can be referred to a patterned sacrificial semiconductor layer 16, and each remaining portion of the semiconductor channel material layers 18L can be referred to as patterned semiconductor channel material layers 18. In the illustrated embodiment of the present application, eight patterned material stacks (namely PS1, PS2, PS3, PS4, PS5, PS6, PS7 and PS8, wherein PS denotes a patterned material stack) are shown by way of one example. In FIG. 2A, each of the patterned materials stacks, i.e., PS1, PS2, PS3, PS4, PS5, PS6, PS7 and PS8, are arranged in rows. In the illustrated embodiments, PS1 and PS2 will be used in providing a first ($1^{st}$) CMOS cell, PS3 and PS4 will be used in providing a second ($2^{nd}$) CMOS cell, PS5 and PS6 will be used in providing a third ($3^{rd}$) CMOS cell, and PS7 and PS8 will be used in providing a fourth ($4^{th}$) CMOS cell. The number of patterned material stacks and CMOS cells that are formed is not limited to the embodiment that is illustrated in FIGS. 2A-2B.

Each shallow trench isolation structure 20 is composed of a trench dielectric material such as, for example, silicon oxide. In some embodiments, a trench dielectric liner composed of, for example, SiN, can be present along a sidewall and a bottom wall of the trench dielectric material. Each of the shallow trench isolation structures 20 has a topmost surface that is substantially coplanar with, or slightly above or below, a topmost surface of the second semiconductor layer 14. The shallow trench isolation structures 20 can be formed by etching a trench into an upper portion of the substrate, e.g., the trench can be formed into the second semiconductor layer 16 of the substrate, and then filling that trench with at least a trench dielectric material as defined below. The etching of the trench can include a same or different etch than the etch used in forming the patterned material stacks. After trench fill, a recess etch can be performed.

Figure 3A:
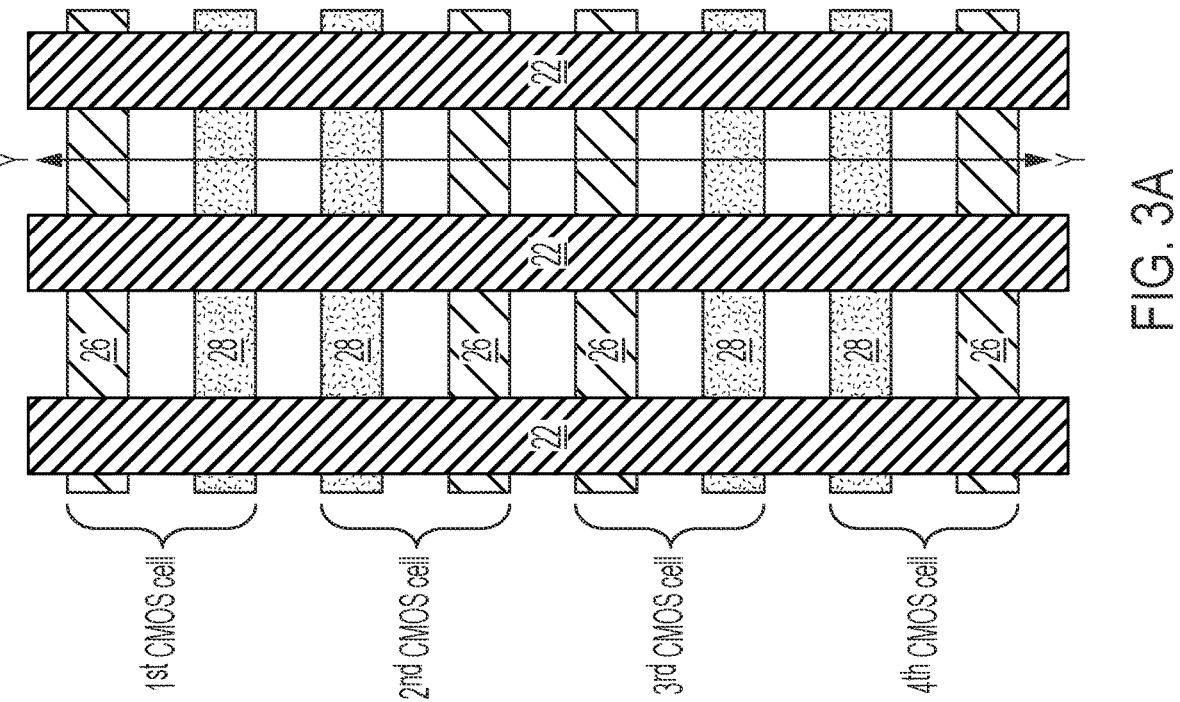
FIGS. 3A-3B are various views of the exemplary semiconductor structure shown in FIGS. 2A and 2B, respectively, after forming sacrificial gate structures, gate spacers, nanosheet stacks, inner spacers, backside source/drain contact placeholder structures, and source/drain regions.
Figure 3B:
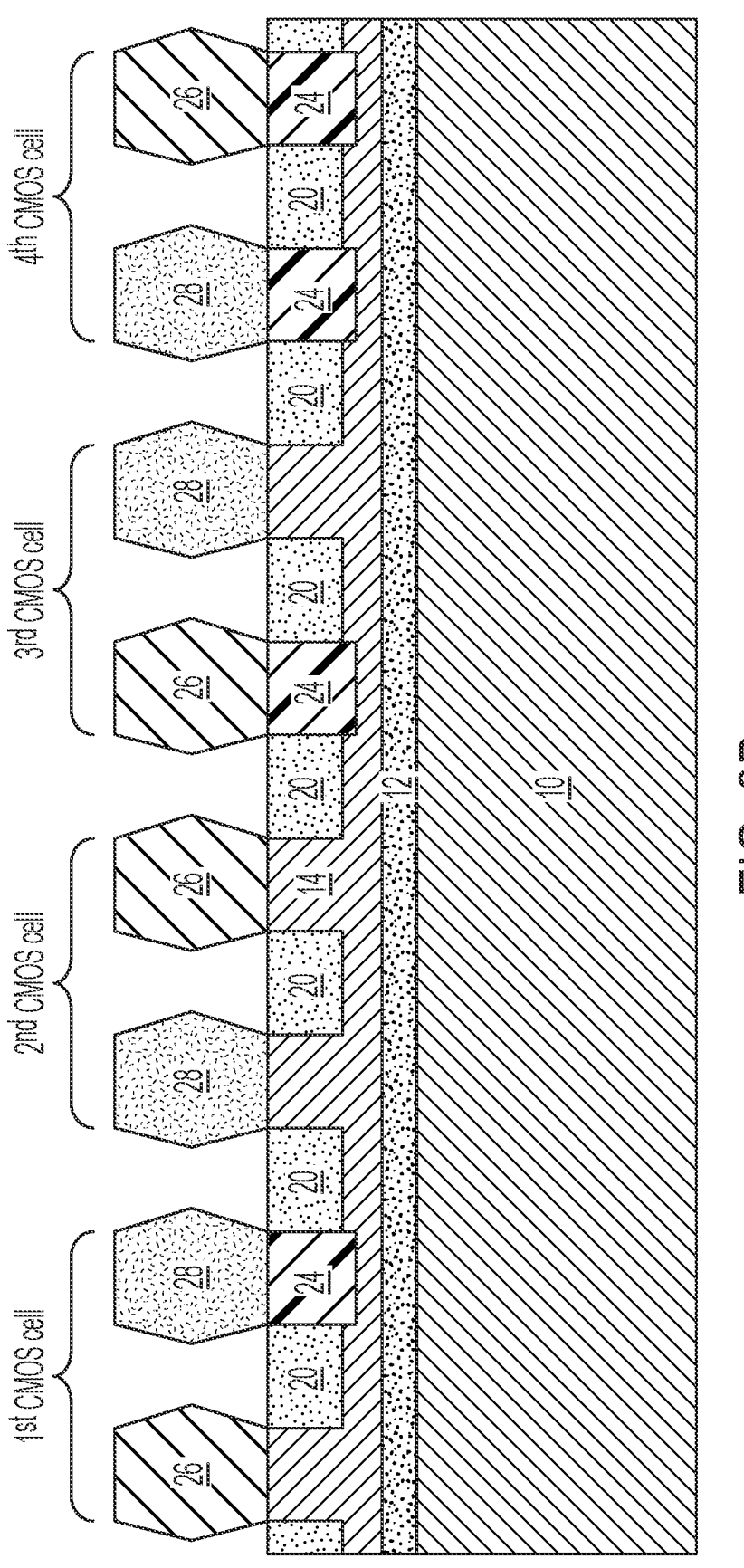

Referring now to FIGS. 3A-3B, there are illustrated the exemplary semiconductor structure shown in FIGS. 2A and 2B, respectively, after forming sacrificial gate structures 22, gate spacers (not illustrated), nanosheet stacks (not illustrated), inner spacers (not illustrated), backside source/drain contact placeholder structures 24, and source/drain regions (i.e., first source/drain regions 26 and second source/drain regions 28). It is noted that some of the aforementioned components/elements/structures are not shown in FIG. 3A for clarity, and some of the aforementioned components/elements/structures are not present in the cross sectional view Y-Y that is depicted in FIG. 3B.

Each sacrificial gate structure 22 includes at least a sacrificial gate material. In some embodiments, each sacrificial gate structure 22 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium. In the present application, each sacrificial gate structure 22 can be formed depositing a blanket layer of optional sacrificial gate dielectric material (if the same is present), and a blanket layer of the sacrificial gate material. Deposition can include, for example, CVD, PECVD, or physical vapor deposition (PVD). These blanket deposition layers are then patterned by lithography and etching to provide the sacrificial gate structures 22. In the present application, each sacrificial gate structures 22 rub perpendicular to each of the patterned material stacks and straddle over a portion of each of the patterned material stacks as is shown, for example, in FIG. 3A. By "straddle over" it is meant that the a material layer/structure is present on top of and along two opposing sidewalls of another material layer/structure.

After formation of the sacrificial gate structures 22, a gate spacer (not shown) is formed along the sidewalls of each of the sacrificial gate structures. Note that the gate spacers would be absent from the Y-Y cut and thus are not shown in FIG. 3B. The gate spacer is composed of a dielectric spacer material such as, for example, silicon dioxide, SiN, SiBCN, SiOCN or SiOC. The gate spacer can be formed by deposition of the dielectric spacer material, followed by a spacer etch.

Next, nanosheet stacks are formed. Nanosheet stack formation includes etching each of the patterned materials stacks, e.g., PS1, PS2, PS3, PS3, PS5, PS6, PS7 and PS8, utilizing each sacrificial gate structure 22 and the dielectric spacer that is present along the sidewalls of the sacrificial gate structures 22 as a combined etch mask. This etch creates nanosheet stacks under each combined etch mask. Each nanosheet stack includes remaining, i.e., non-etched, portions of the alternating patterned sacrificial semiconductor material layers 16 and patterned semiconductor channel material layers 18 of each of the patterned material stacks. Within each of the nanosheet stacks, each remaining, i.e., non-etched, portion of the patterned sacrificial semiconductor material layers 16 can be referred to as a sacrificial semiconductor material nanosheet, and each remaining, i.e., non-etched, portion of the patterned semiconductor channel material layers 18 can be referred to as a semiconductor channel material nanosheet. Nanosheet stacks would be located beneath portions of each of the sacrificial gate structures 22 shown in FIG. 3A that intersect with the patterned material stacks; the nanosheet stacks are not shown in FIG. 3B since they would run into and out of the drawing sheet including FIG. 3B.

After forming nanosheet stacks, inner dielectric spacers (also not shown) are formed. The inner dielectric spacers are formed by recessing each of the sacrificial semiconductor material nanosheets of the various nanosheet stacks. This recess is a lateral etch that removes end portions of the sacrificial semiconductor material nanosheets. The lateral etch is selective in removing the third semiconductor material that provides the sacrificial semiconductor material layers 16L. Within each of the nanosheet stacks, the recessed sacrificial semiconductor material nanosheets have a length that is less than a length of the semiconductor channel material nanosheets (the semiconductor channel material nanosheets are not recessed by this lateral etch). A gap is formed at the end of each of the recessed sacrificial semiconductor material nanosheets. One of the above dielectric spacer materials is then formed within each of the gaps to provide the inner spacers. The dielectric spacer material used in providing the inner spacers is formed by deposition (e.g., CVD, PECVD or atomic layer deposition (ALD)), followed by an isotropic etch process. The inner spacers will serve as support pillars during the subsequent removal of the sacrificial semiconductor material nanosheets and will aid in suspending the semiconductor channel material nanosheets.

After inner spacer formation, backside source/drain contact placeholder structures 24 can be formed into an upper portion of the substrate, e.g., into the second semiconductor layer 14. The backside source/drain contact placeholder structures 24 can be formed by etching backside source/drain contact placeholder structure trenches into an upper portion of the substrate. In the illustrated embodiment, the backside source/drain contact placeholder structure trenches are formed into an upper portion of the second semiconductor layer 14. Each of the backside source/drain contact placeholder structure trenches physically exposes a subsurface of the substrate. In the illustrated embodiments, the backside source/drain contact placeholder structure trenches physically expose a sub-surface of the second semiconductor layer 14. Each of the backside source/drain contact placeholder structure trenches is then filled with a placeholder material. In embodiments, the placeholder material is composed of a fifth semiconductor material. In one example, the fifth semiconductor material is composed of a silicon germanium alloy. The backside source/drain contact placeholder structures 24 can be formed by deposition (e.g., CVD, PECVD or epitaxial growth) of the fifth semiconductor material, followed by a recess etch.

Next, source/drain regions (i.e., first source/drain regions 26 and second source/drain regions 28) are formed. The first source/drain region 26 and the second source/drain regions

28 are of an opposite conductivity type (i.e., n-type or p-type). By way of illustration only, the first source/drain regions 26 are n-type source/drain regions (i.e., n-doped source/drain regions), and the second source/drain regions 28 are p-type source/drain regions (i.e., p-doped source/drain regions). The reverse conductivity type for the first and second source/drain regions is possible. In embodiments and as is illustrated in FIG. 3B, the first source/drain regions 26 and the second source/drain regions 28 are faceted source/drain regions.

The n-doped source/drain regions are composed of a sixth semiconductor material and an n-type dopant, while the p-doped source/drain regions are composed of a seventh semiconductor material and a p-type dopant. As used herein, a "source/drain" region can be a source region or a drain region depending on subsequent wiring and application of voltages during operation of the transistor. The sixth and seventh semiconductor materials can be compositionally the same, or compositionally different from, the fourth semiconductor material that provides each semiconductor channel material nanosheet, and the fifth semiconductor material that provides the backside source/drain contact placeholder structures 24. The sixth semiconductor material can be compositionally the same, or compositionally different from, the seventh semiconductor material. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region can have a dopant concentration of from $4\times10^{20}$ atoms/cm$^3$ to $3\times10^{21}$ atoms/cm$^3$. The first source/drain regions 26 and the second source/drain regions 28 are typically formed by an epitaxial growth process, as defined above, utilizing block mask technology to form one of the conductivity type source/drain regions prior to forming the other conductivity type source/drain regions. A recess etch can follow the epitaxial growth process.

The cross sectional view illustrated in FIG. 3B illustrates the formation, from left to right, first source/drain region 26 and second source/drain region 28 in a region including the first CMOS cell, second source/drain region 28 and first source/drain region 26 in the region including the second CMOS cell, first source/drain region 26 and second source/drain region 28 in region including the third CMOS cell, and second source/drain region 28 and first source/drain region 26 in the region including the fourth CMOS cell.

At this point of the present application, some first source/drain regions 26 are formed on a physically exposed surface of the substrate, i.e., the second semiconductor layer 16, while other first source/drain regions 26 are formed on a physically exposed surface of the backside source/drain contact placeholder structures 24. Likewise some second source/drain regions 28 are formed on a physically exposed surface of the substrate, i.e., the second semiconductor layer 16, while other second source/drain regions 28 are formed on a physically exposed surface of the backside source/drain contact placeholder structures 24.

Figure 4A:
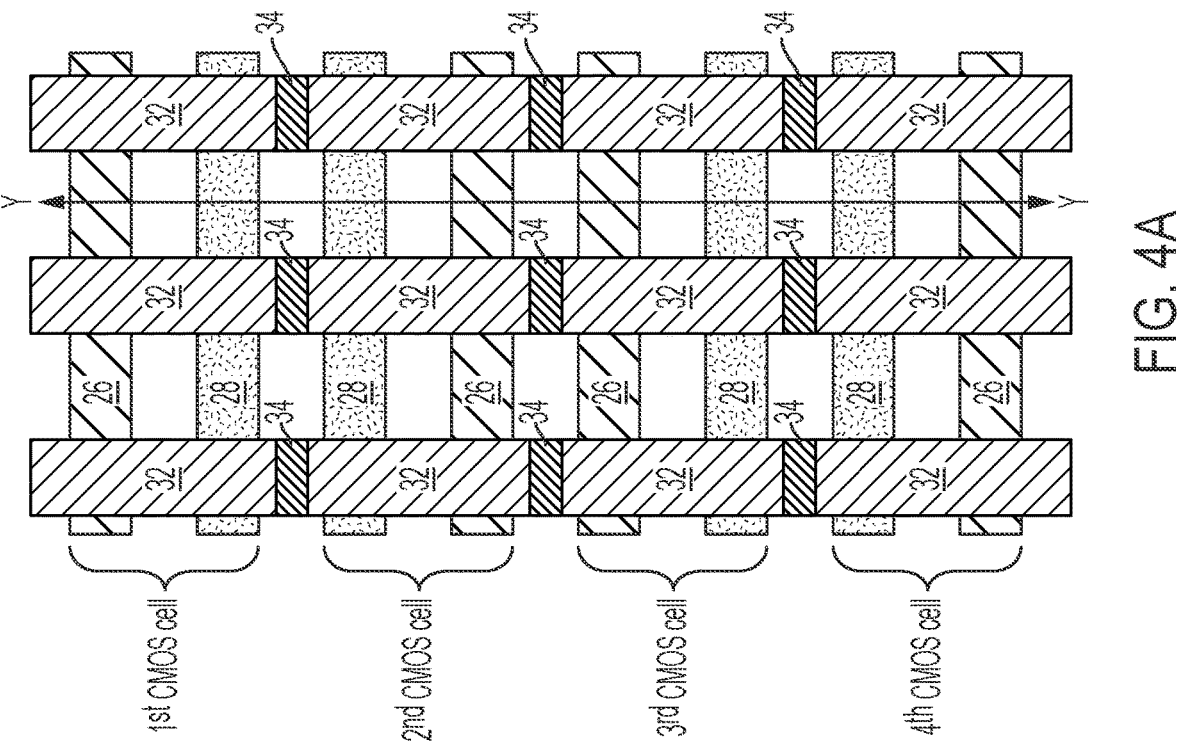
FIGS. 4A-4B are various views of the exemplary semiconductor structure shown in FIGS. 3A and 3B, respectively, after forming a first frontside ILD layer having a first thermal conductivity, forming gate cut structures, removing the sacrificial gate structures, removing each sacrificial semiconductor material nanosheet of the nanosheet stacks, and forming a gate structure wrapping around each semiconductor channel material nanosheet.
Figure 4B:
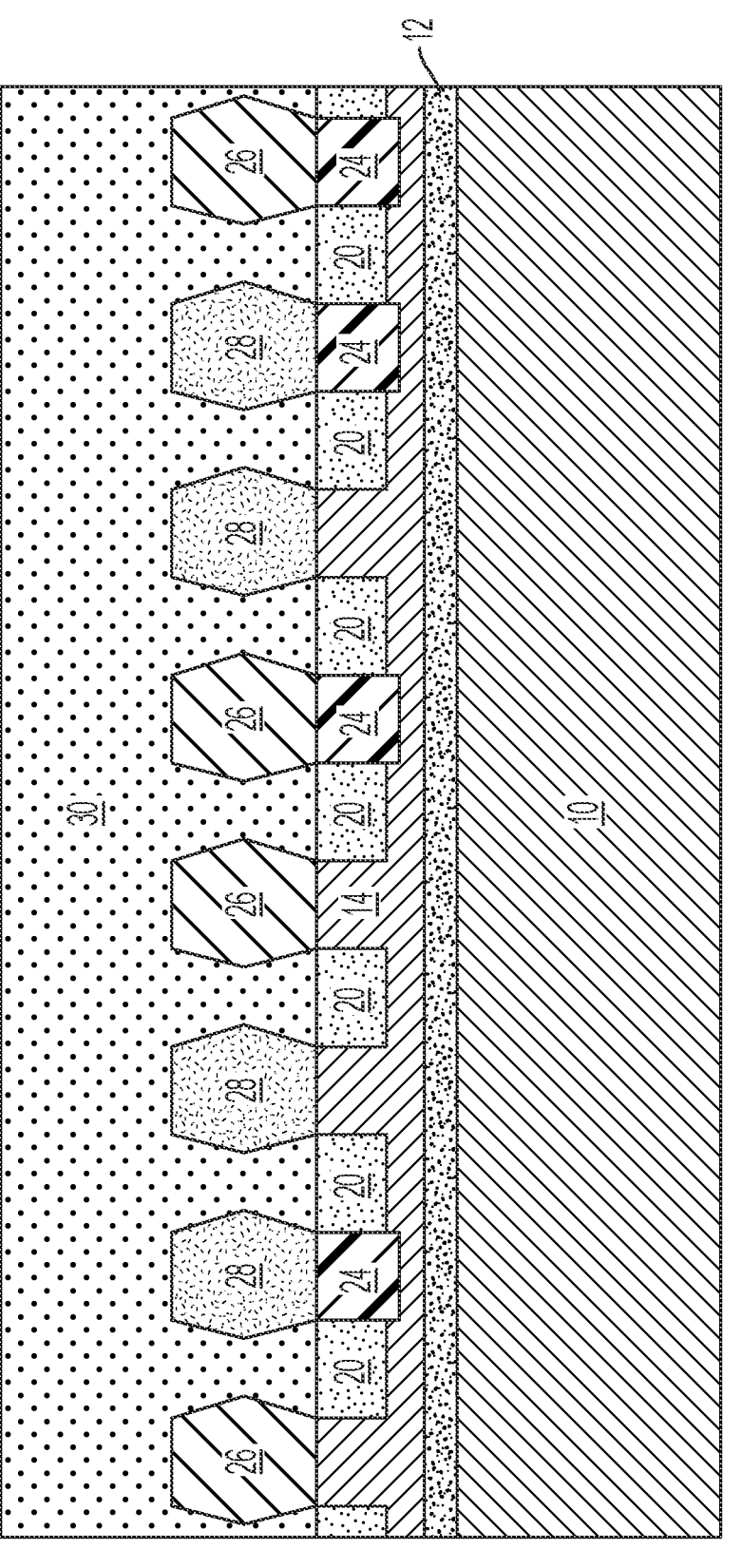

Referring now to FIGS. 4A-4B, there are illustrated the exemplary semiconductor structure shown in FIGS. 3A and 3B, respectively, after forming a first frontside ILD layer 30 having a first thermal conductivity, forming gate cut structures 34, removing the sacrificial gate structures 22, removing each sacrificial semiconductor material nanosheet of the nanosheet stacks, and forming a gate structure 32 wrapping around each semiconductor channel material nanosheets. The first frontside ILD layer 30 is composed of a first ILD dielectric material that has a first dielectric constant, k1 and the first thermal conductivity. The first dielectric constant, k1, is typically 4.0 or greater; i.e., the first ILD material is a high-k material. All dielectric constants mentioned herein are relative to a vacuum unless otherwise noted. The first thermal conductivity of the first frontside ILD layer 30 is typically 1 W/(m*K) or greater (typically 3 W/(m*K) or greater). Illustrated examples of first ILD dielectric materials that can be used in providing the first frontside ILD layer 30 include, but are not limited to, silicon oxide, SiNCH or a multilayered combination thereof. The first frontside ILD layer 30 can be formed by a deposition process such as, for example, CVD, PECVD or spin-on coating. A planarization process including chemical mechanical polishing (CMP) and/or grinding can follow the deposition of this first ILD material.

After forming the first frontside ILD layer 30, gate cut structures 34 are formed. The gate cut structures 34 are pillars that cut the gate regions. The gate cut structures 34 are formed by first forming gate cut openings into various portions of each of the sacrificial gate structures 22 that are not located over any nanosheet stack. These openings can be formed by gate cut patterning process that includes lithography and etching. This etch stops on a surface the shallow trench isolation structures 20. A cut gate dielectric material including, for example, SiC, SiOC or SiOCN is then formed into each of the gate cut openings by a deposition process, such as, for example, CVD, PECVD, or ALD. A planarization process such as, for example, chemical mechanical polishing follows the deposition of the gate cut dielectric material.

Following gate cut structure 34 formation, each sacrificial gate structures 22 can be removed from the structure utilizing a material removal process such as, for example, etching, that is selective in removing the sacrificial gate structures 22. This material removal steps revels the underlying nanosheet stacks. After revealing the nanosheet stacks, each sacrificial semiconductor material nanosheet is removed. The removal of the sacrificial semiconductor material nanosheet suspends a portion of each semiconductor channel material nanosheet. Each sacrificial semiconductor material nanosheet is removed utilizing any material removal process such as, for example, etching, which is selective in removing the sacrificial semiconductor material nanosheets.

The gate structure 32 is formed in the area previously accompanied by the sacrificial semiconductor material nanosheets as well as atop the topmost semiconductor channel material nanosheet of each of the nanosheet stacks. The gate structure 32 wraps around each of the semiconductor material nanosheets within the nanosheet stacks. The gate structure 32 includes a gate dielectric layer and a gate electrode; both the gate dielectric layer and the gate electrode are not separately shown in the drawing, but both are included in the area shown as the gate structure 32. As is known, the gate dielectric layer is formed directly around the suspended portion of each semiconductor channel material nanosheet and the gate electrode is formed on the gate dielectric layer. The gate dielectric layer of the gate structure is composed of a gate dielectric material that has a dielectric constant of greater than 4.0. Illustrative examples of gate dielectric materials that can be used in providing the gate dielectric layer include, but are not limited to, hafnium dioxide (HfO$_2$), hafnium silicon oxide (HfSiO), hafnium silicon oxynitride (HfSiO), lanthanum oxide (La$_2$O$_3$), lanthanum aluminum oxide (LaAlO$_3$), zirconium dioxide (ZrO$_2$), zirconium silicon oxide (ZrSiO$_4$), zirconium silicon oxynitride (ZrSiO$_x$N$_y$), tantalum oxide (TaO$_x$), titanium oxide (TiO), barium strontium titanium oxide (BaO$_6$SrTi$_2$), barium titanium oxide (BaTiO$_3$), strontium titanium oxide (SrTiO$_3$), yttrium oxide (Yb$_2$O$_3$), aluminum oxide (Al$_2$O$_3$), lead scandium tantalum oxide (Pb(Sc,Ta)O$_3$), and/or lead zinc niobite (Pb(Zn,Nb)O). The gate dielectric material can further include dopants such as lanthanum (La), aluminum (Al) and/or magnesium (Mg).

The gate electrode of the gate structure 32 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In embodiments, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In embodiments, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 32 can be formed by deposition of the gate dielectric material and the gate electrode material, followed by a planarization process.

Figure 5:
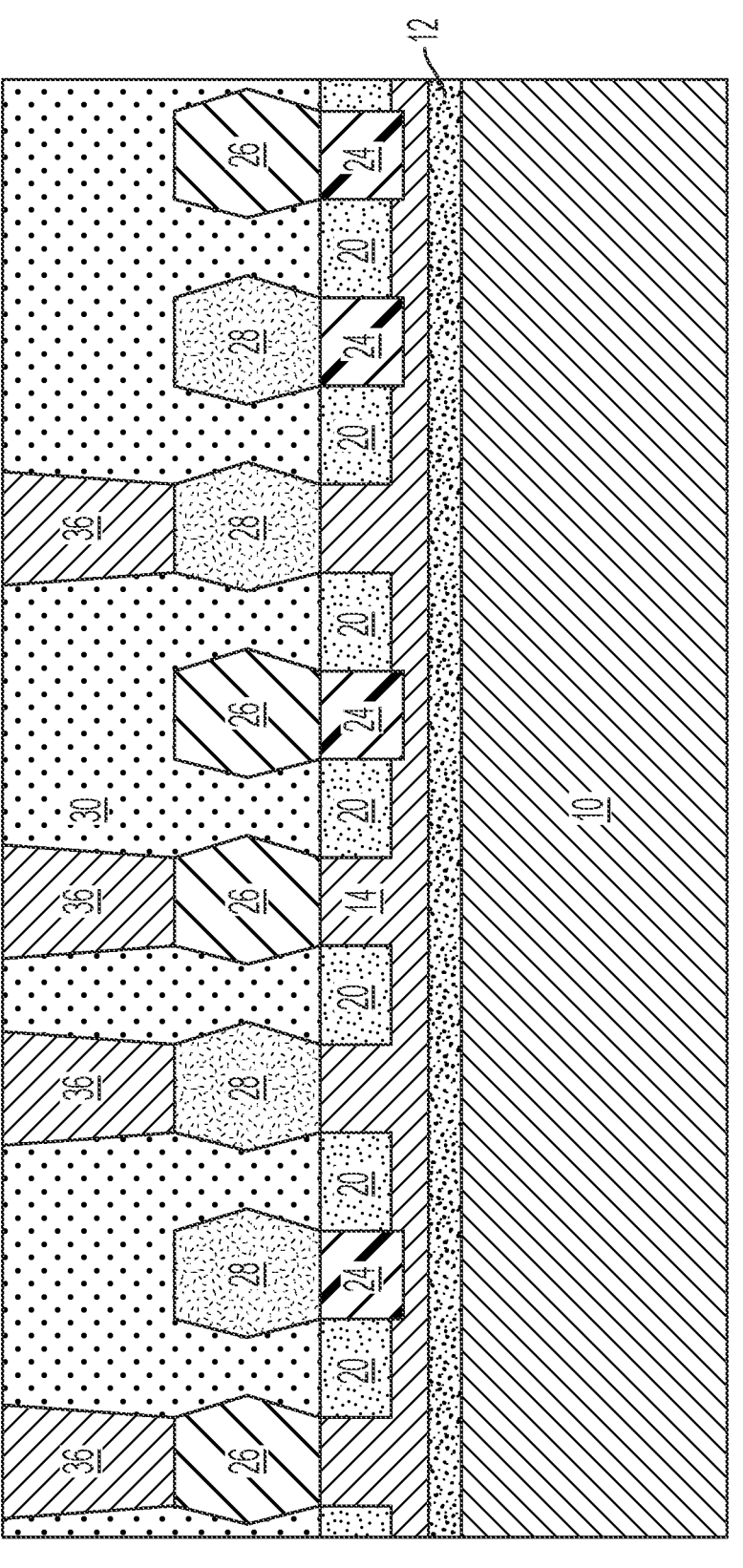
FIG. 5 is a cross sectional view of the exemplary semiconductor structure shown in FIG. 4B after forming frontside source/drain contact structures in the first frontside ILD layer.

Referring now to FIG. 5, there is illustrated the exemplary semiconductor structure shown in FIG. 4B after forming frontside source/drain contact structures 36 in the first frontside ILD layer 30. The frontside source/drain contact structures 36 are formed utilizing a metallization process that includes first forming frontside source/drain contact openings in the first frontside ILD layer 30. These openings physically expose some of the source/drain regions (i.e., first source/drain regions 26 and second source/drain regions 28) that are present in both regions. The frontside source/drain contact openings are then filled (including deposition and planarization) with at least a contact conductor material. The contact conductor material includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside source/drain contact structures 36 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above Referring now to FIG. 6, there is illustrated the exemplary semiconductor structure shown in FIG. 5 after forming a patterned OPL 38 blocking a second region of the structure, while leaving a first region of the structure open. The first region defines a region in which a critical circuit path as defined above is present, while the second region defines a region in which a non-critical circuit path as defined above provided. The patterned OPL 38 can be formed by deposition of an organic planarization material, followed by lithographic patterning. The deposition of the organic planarization material can include, for example, CVD, PECVD or spin-on coating.

Figure 6:
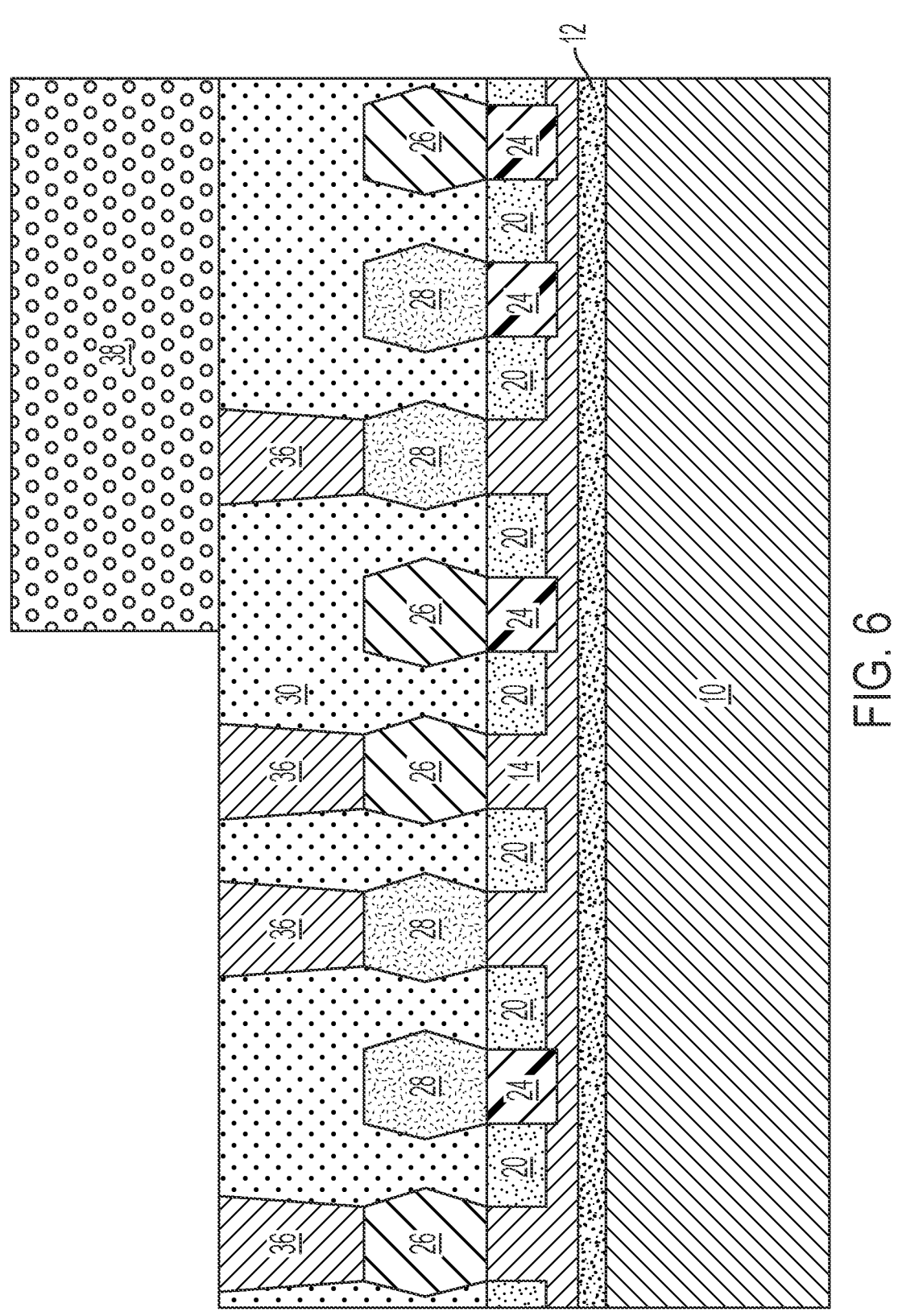
FIG. 6 is a cross sectional view of the exemplary semiconductor structure shown in FIG. 5 after forming a patterned organic planarization layer (OPL) blocking a second region of the structure, while leaving a first region of the structure open.
Figure 7:
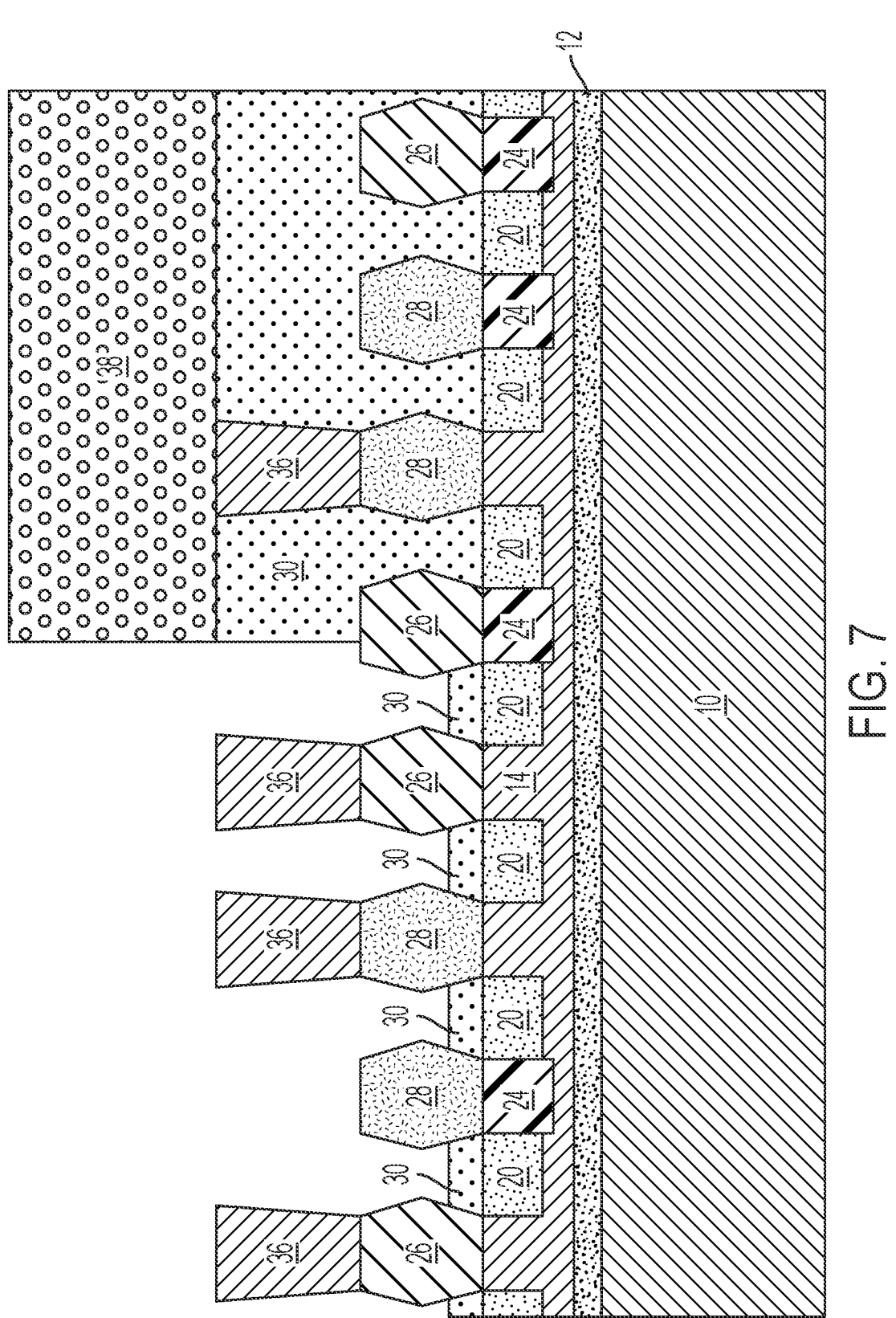
FIG. 7 is a cross sectional view of the exemplary semiconductor structure shown in FIG. 6 after removing at least a portion of the first frontside ILD layer from the first region of the structure.

Referring now to FIG. 7, there is illustrated the exemplary semiconductor structure shown in FIG. 6 after removing at least a portion of the first frontside ILD layer 30 from the first region of the structure. In some embodiments when the pitch between the adjacent source/drain regions in the first region are tight, and as is illustrated in FIG. 7, this removal steps removes a majority of the first frontside ILD layer 30 in the first region, while leaving a small portion of the first frontside ILD layer 30 in the first region that is located on a surface of the shallow trench isolation structure 20 and in an area that is located between adjacent source/drain regions. The term "tight pitch" denotes a pitch of 24 (typically 21) nm or less. In other embodiments (not shown, but readily discernible from FIG. 7), all of the first frontside ILD layer 30 can be removed from the first region; this embodiment occurs when the pitch is greater than 32 nm. This removal step of the present applicant does not remove the first source/drain regions 26, the second source/drain regions 28, or the frontside source/drain contact structures 36 that are present in the first region. Note that all of the first frontside ILD layer 30 remains in the second region since the patterned OPL 38 protects the first frontside ILD layer 30 that is present in the second region. The removal of at least a portion of the first frontside ILD layer 30 from the first region includes an etch that is selective in removing the ILD material that provided the first frontside ILD layer 30 using the patterned OPL 38 as an etch mask.

Figure 8:
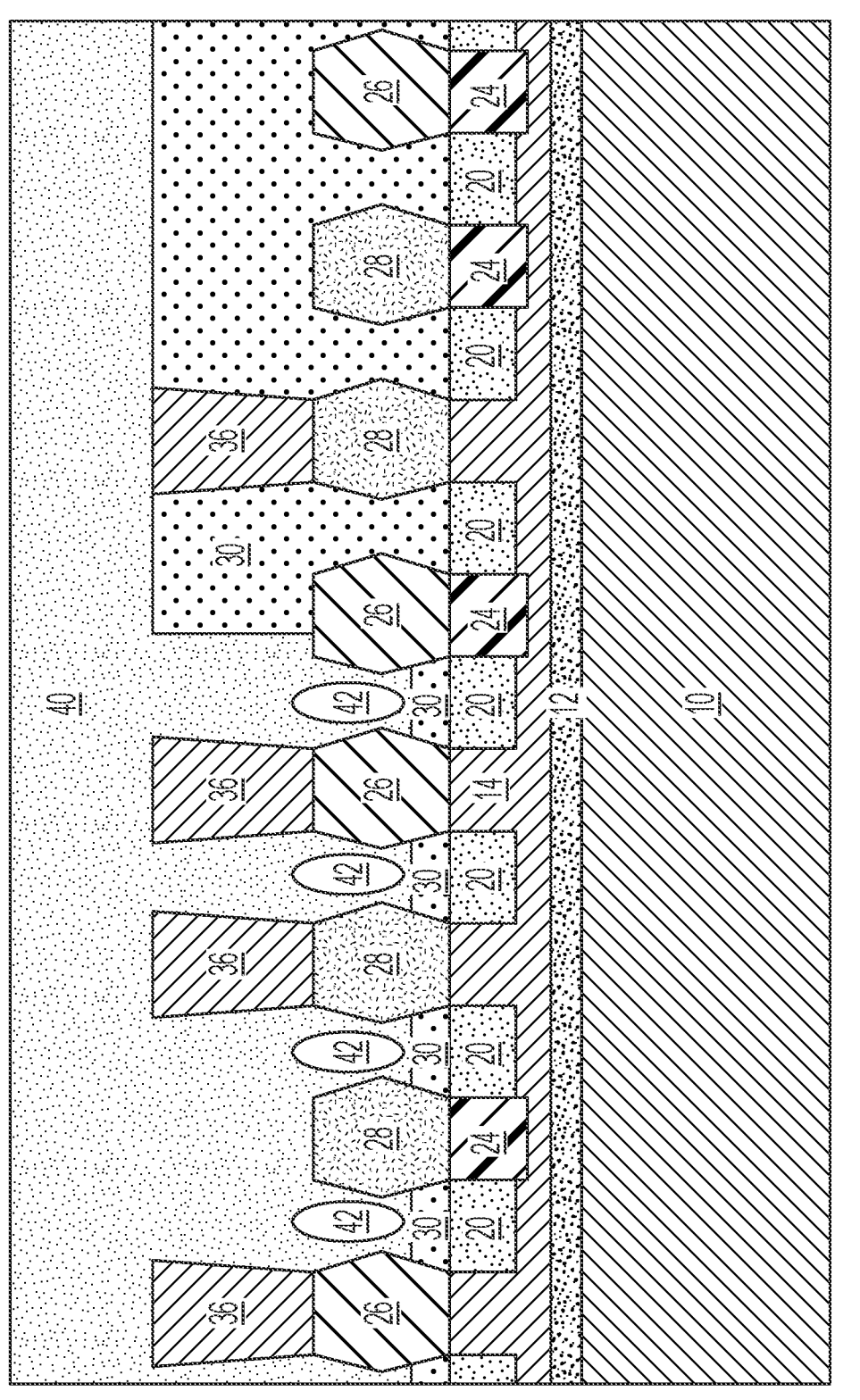
FIG. 8 is a cross sectional view of the exemplary semiconductor structure shown in FIG. 7 after removing the patterned OPL and forming a second frontside ILD layer having a second thermal conductivity in both the first region and in the second region of the structure.

Referring now to FIG. 8, there is illustrated the exemplary semiconductor structure shown in FIG. 7 after removing the patterned OPL 38 and forming a second frontside ILD layer 40 having a second thermal conductivity in both the first region and in the second region of the structure. The removal of the patterned OPL 38 can be performed utilizing any material removal process that is selective in removing the material that provides the patterned OPL 38.

The second frontside ILD layer 40 is composed of a second ILD dielectric material that has a second dielectric constant, k2 and the second thermal conductivity. In the present application, k2 is less than k1, and the second thermal conductivity is lower than the first thermal conductivity. The second dielectric constant, k2, is typically less than 4.0; the second ILD material is thus a low-k dielectric material. The second thermal conductivity of the second frontside ILD layer 40 is typically less than 0.3 W/(m*K). Illustrated examples of second ILD dielectric materials that can be used in providing the second frontside ILD layer 40 include, but are not limited to, fluorinated-doped silicon dioxide, carbon doped oxides (porous or non-porous), spin-on organic polymeric dielectrics, spin-on silicon based polymeric dielectrics or multilayered layered combinations thereof. The second frontside ILD layer 40 can be formed by a deposition process such as, for example, CVD, PECVD or spin-on coating. A planarization process including CMP and/or grinding can follow the deposition of this second ILD material.

In some embodiments as illustrated in FIG. 8, air gaps 42 can form in the second frontside ILD layer 40 in a region adjacent to each of the first and second source/drain regions 26, 28 that are present in the first region during the deposition of the second ILD material. The air gap 42 form in cases in which a tight pitch is present between the adjacent source/drain regions. In other embodiments in which the pitch is not tight, no air gaps are formed during the deposition of the second ILD material.

Since the second frontside ILD layer 40 has a low thermal conductivity, any heat that is caused during backside processing will not readily dissipate through the second frontside ILD layer 40. In contrast, and since the first frontside ILD layer 30 has a high thermal conductivity, any heat that is caused during backside processing can dissipate through the first frontside ILD layer 30 at a faster rate than through the second frontside ILD layer 40. This aspect of the present application will be discussed in greater detail herein below.

Figure 9:
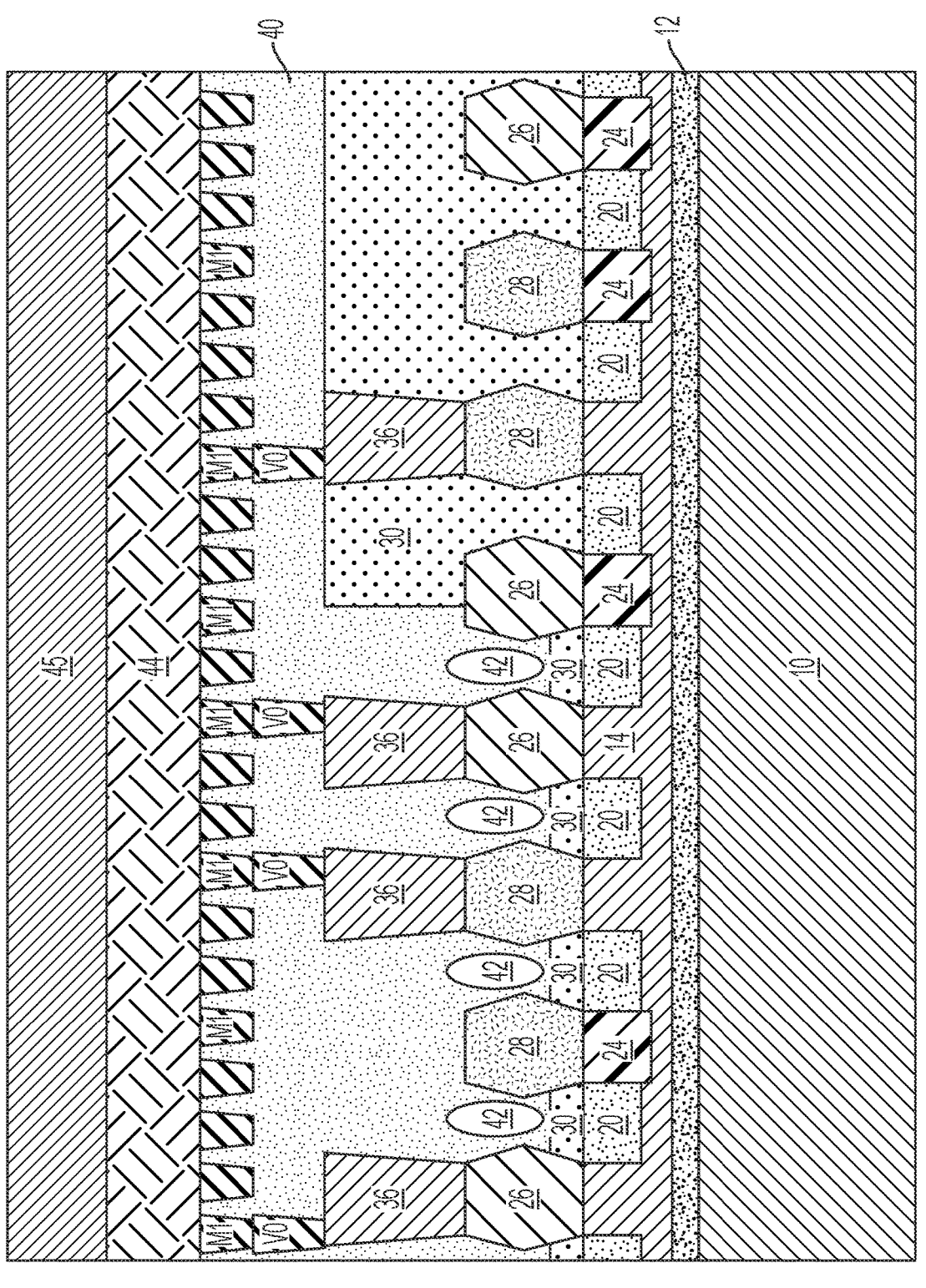
FIG. 9 is a cross sectional view of the exemplary semiconductor structure shown in FIG. 8 after forming electrically conductive metal vias and electrically conductive metal lines in the second frontside ILD layer, forming a frontside BEOL structure on the second frontside ILD layer, and forming a carrier wafer on the frontside BEOL structure.

Referring now to FIG. 9, there is illustrated the exemplary semiconductor structure shown in FIG. 8 after forming electrically conductive metal vias V0 and electrically conductive metal lines M1 in the second frontside ILD layer 40, forming a frontside BEOL structure 44 on the second frontside ILD layer 40, and forming a carrier wafer 45 on the frontside BEOL structure 44. The electrically conductive metal vias V0 and electrically conductive metal lines M1 are formed in both the first region and the second region. The electrically conductive metal vias V0 and electrically conductive metal lines M1 can be formed by a damascene process. The electrically conductive metal vias V0 and electrically conductive metal lines M1 can be composed of any electrically conductive material including, but not limited to, tungsten (W), cobalt (Co), ruthenium (Ru), aluminum (Al), copper (Cu), platinum (Pt), rhodium (Rh), or palladium (Pd). A diffusion barrier, not shown, can be present on at least the sidewalls of the electrically conductive metal vias V0 and electrically conductive metal lines M1. The damascene process includes forming via openings and/or line openings in the second frontside ILD material layer 40 and then filling those openings with at least one of the electrically conductive materials mentioned above. The filling of the openings can include a deposition process such as, for example, CVD, PECVD, ALD, sputtering or plating. A planarization process can follow the deposition process.

Next, frontside BEOL structure 44 is formed entirely along an uppermost surface of the second frontside ILD layer 40 and on a physically exposed surface of each electrically conductive metal line, M1. The frontside BEOL structure 44 can include one or more interconnect dielectric material layers that contain frontside metal wires (the metal wires can be composed of any electrically conductive metal or electrically conductive metal alloy) embedded therein.

The carrier wafer 45 can include one of the semiconductor materials mentioned above for the first semiconductor layer 10. Carrier wafer 45 is bonded to the frontside BEOL structure 44 after frontside BEOL structure 44 formation. This concludes the frontside processing of the semiconductor device of the present application.

Figure 10:
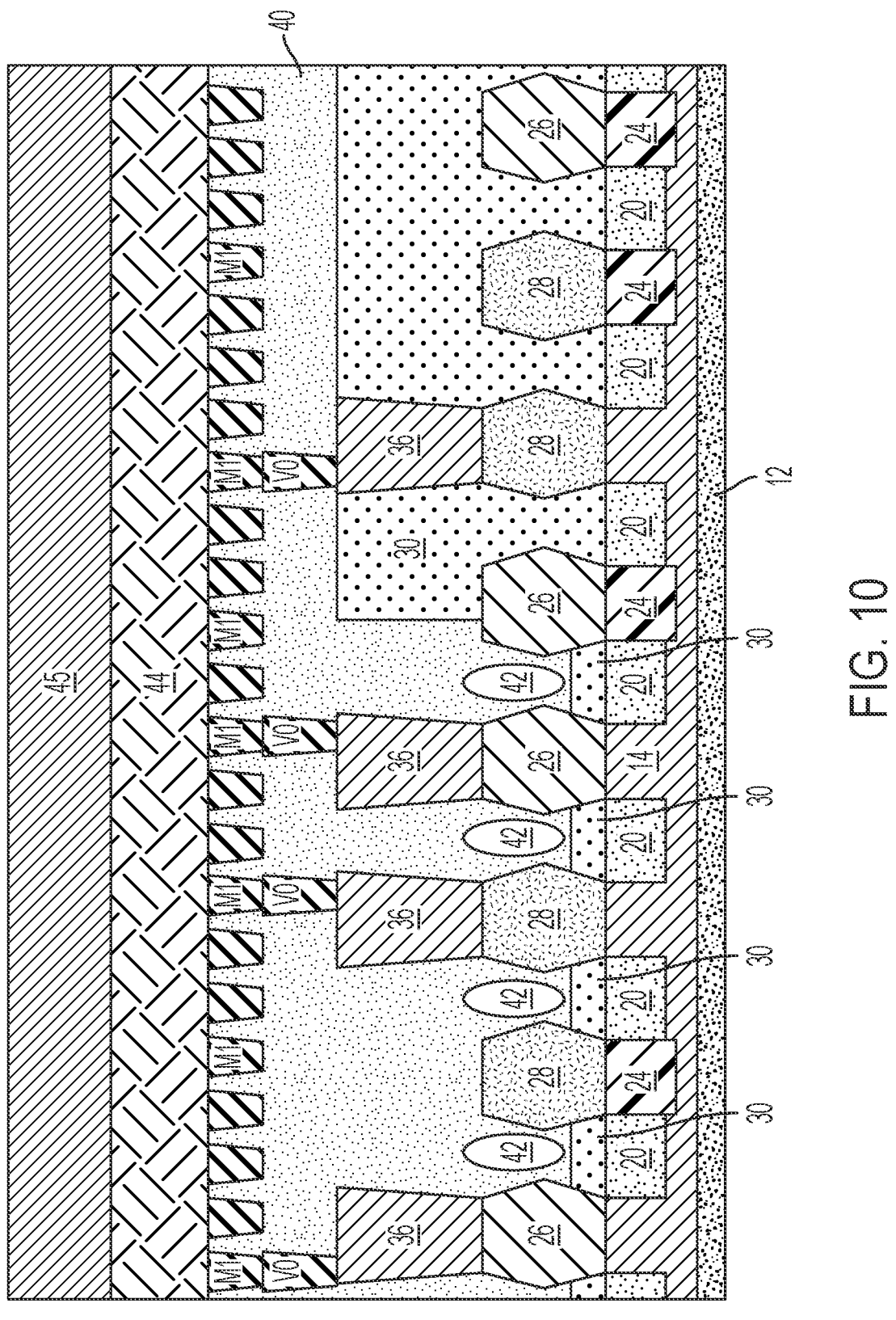
FIG. 10 is a cross sectional view of the exemplary semiconductor structure shown in FIG. 9 after removing a first semiconductor layer of the substrate.

Referring now to FIG. 10, there is illustrated the exemplary semiconductor structure shown in FIG. 9 after removing the first semiconductor layer 10 of the substrate. The removal of the first semiconductor layer 10 typically includes flipping the wafer 180° to physically expose a backside of the substrate. This flipping step is not shown in the drawings of the present application for clarity. The flipping physically exposes the first semiconductor layer 10 and will allow backside processing of the exemplary structure. Flipping can be performed by hand or by utilizing a mechanical means such as, for example, a robot arm. In the illustrated embodiment, the removal of the physically exposed first semiconductor layer 10 physically exposes the etch stop layer 12. The removal of the first semiconductor layer 10 can be performed utilizing a material removal process that is selective in removing the first semiconductor material that provides the first semiconductor layer 10. The step can be omitted in embodiments in which the substrate does not include first semiconductor layer 10.

Figure 11:
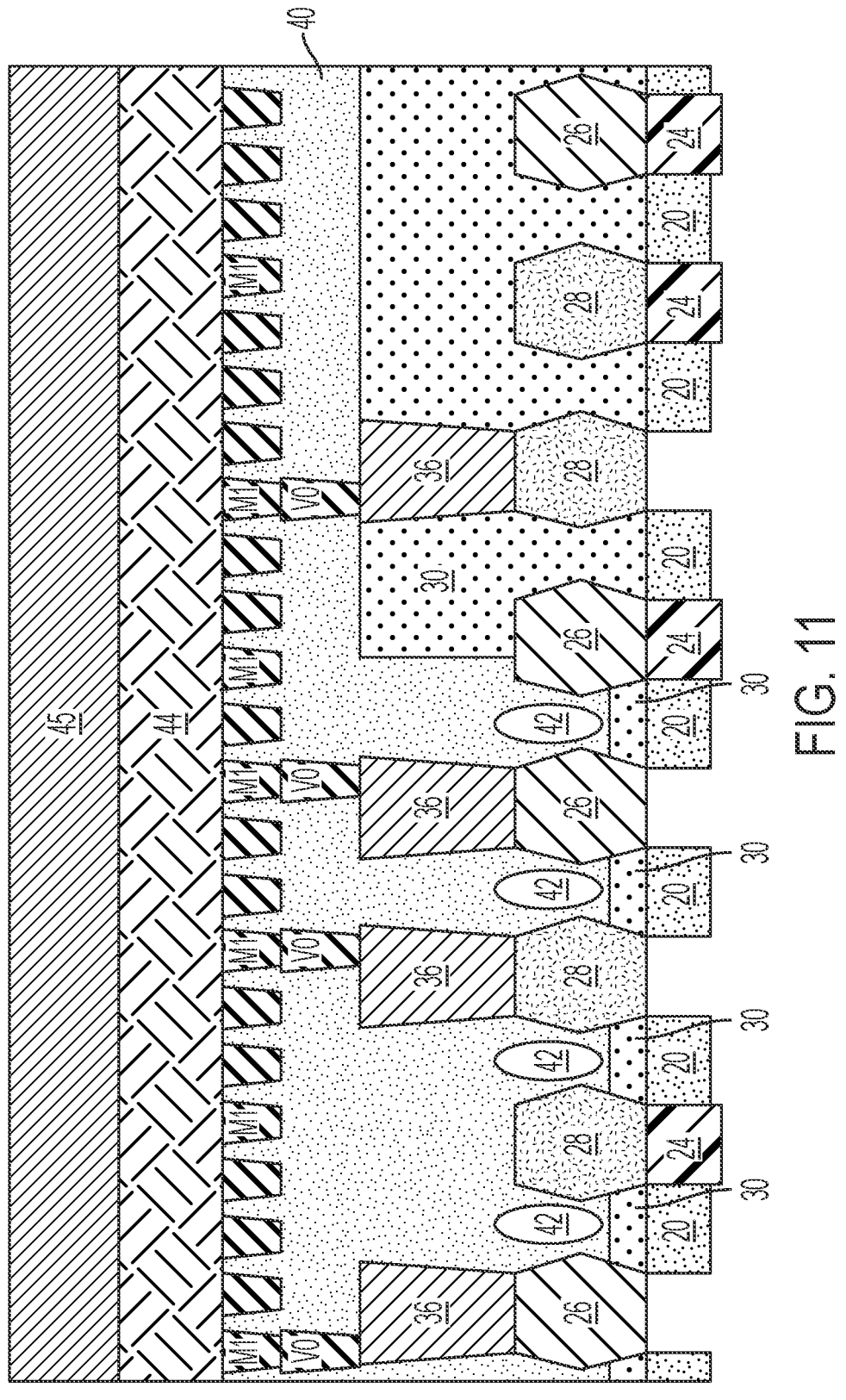
FIG. 11 is a cross sectional view of the exemplary semiconductor structure shown in FIG. 10 after removing an etch stop layer and a second semiconductor layer of the substrate.

Referring now to FIG. 11, there is illustrated the exemplary semiconductor structure shown in FIG. 10 after removing the etch stop layer 12 and the second semiconductor layer 14 of the substrate. The removal of the etch stop layer 12 includes a material removal process that is selective in removing the etch stop layer 12. The removal of the etch stop layer 12 physically exposes the second semiconductor layer 14. The physically exposed second semiconductor layer 14 can be removed utilizing a material removal process that is selective in removing that layer from the structure.

Figure 12:
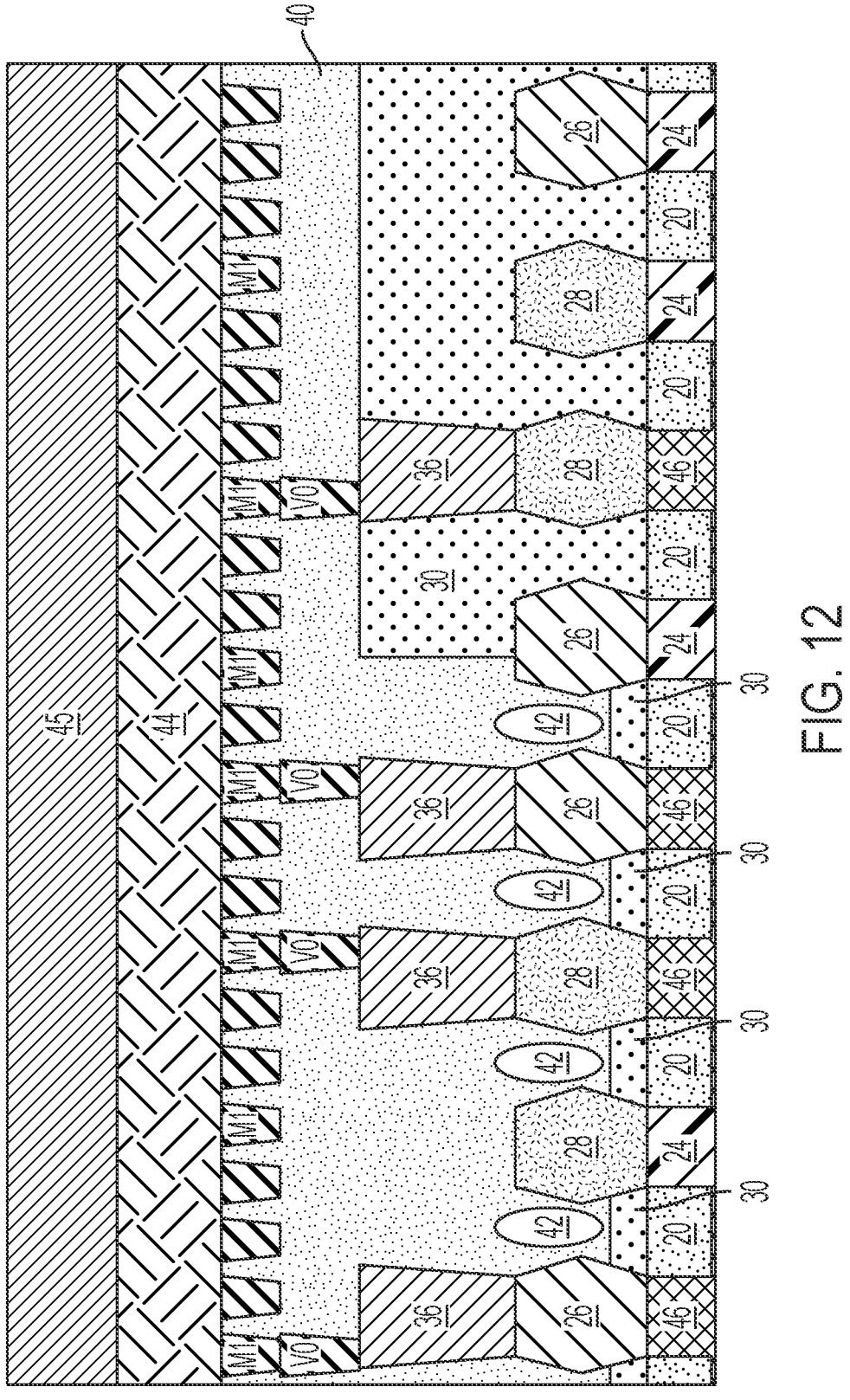
FIG. 12 is a cross sectional view of the exemplary semiconductor structure shown in FIG. 11 after forming a first backside ILD layer.

Referring now to FIG. 12, there is illustrated the exemplary semiconductor structure shown in FIG. 11 after forming a first backside ILD layer 46. The first backside ILD layer 46 can be composed of an ILD material such as, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" as used throughout the present application denotes a dielectric material that has a dielectric constant of less than 4.0 The first backside ILD layer 46 can be formed by deposition of the dielectric material (CVD, PECVD or spin-on coating), followed by a planarization process. Planarization can include CMP and/or grinding. The planarization step revels a bottommost surface of each backside source/drain contact placeholder structures 24.

Figure 13:
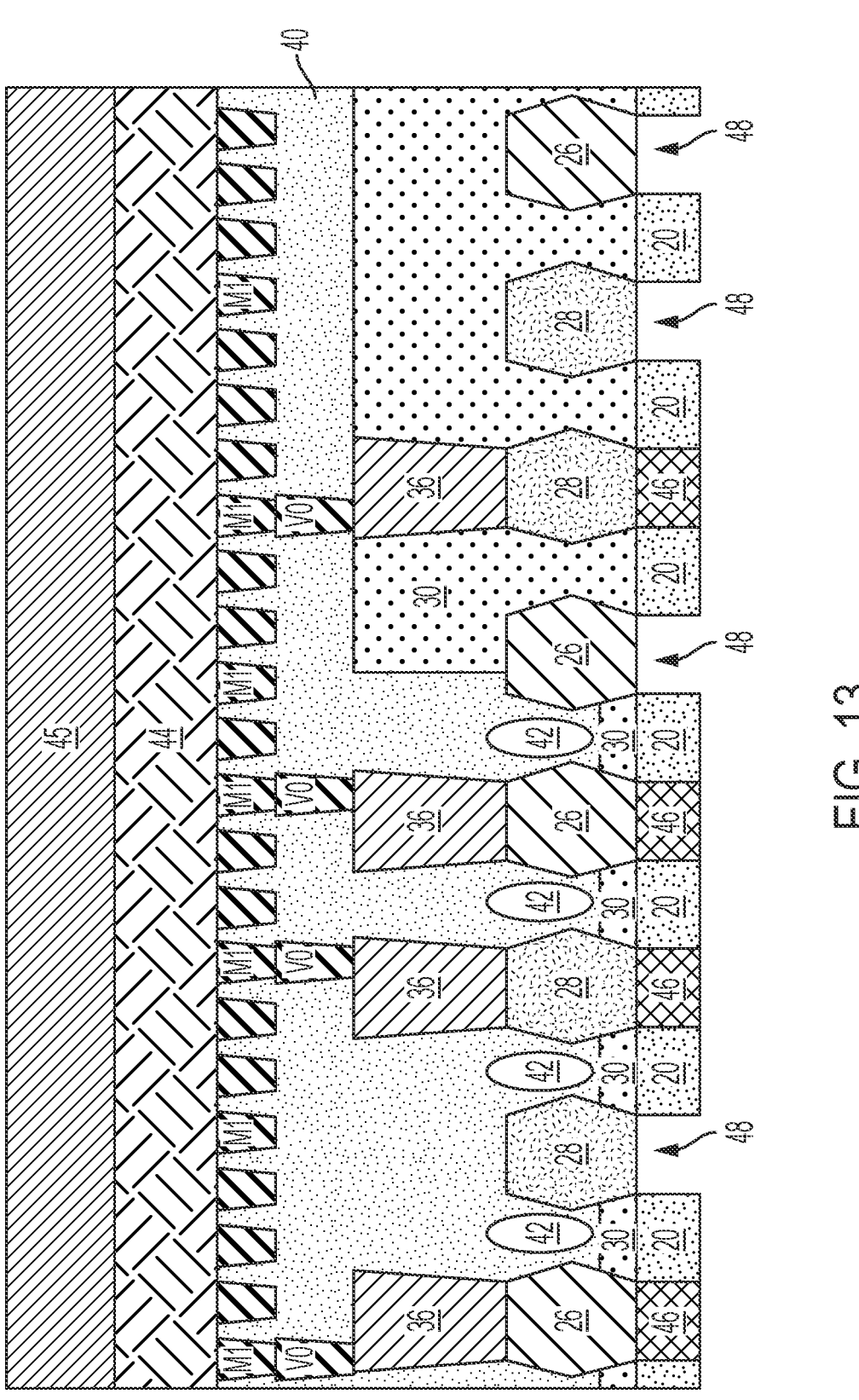
FIG. 13 is a cross sectional view of the exemplary semiconductor structure shown in FIG. 12 after removing each of the backside source/drain contact placeholder structures.

Referring now to FIG. 13, there is illustrated the exemplary semiconductor structure shown in FIG. 12 after removing each of the backside source/drain contact placeholder structures 24. The removal of the backside source/drain contact placeholder structures 24 includes a material removal process such as, for example, an etch, that is selective in removing the backside source/drain contact placeholder structure 24. This removal reveals a bottom surface of some of the first source/drain regions 26 and some of the second source/drain regions 28. This removal step forms backside source/drain contact openings 48 in the area that was previously occupied by one of the backside source/drain contact placeholder structures 24.

Figure 14:
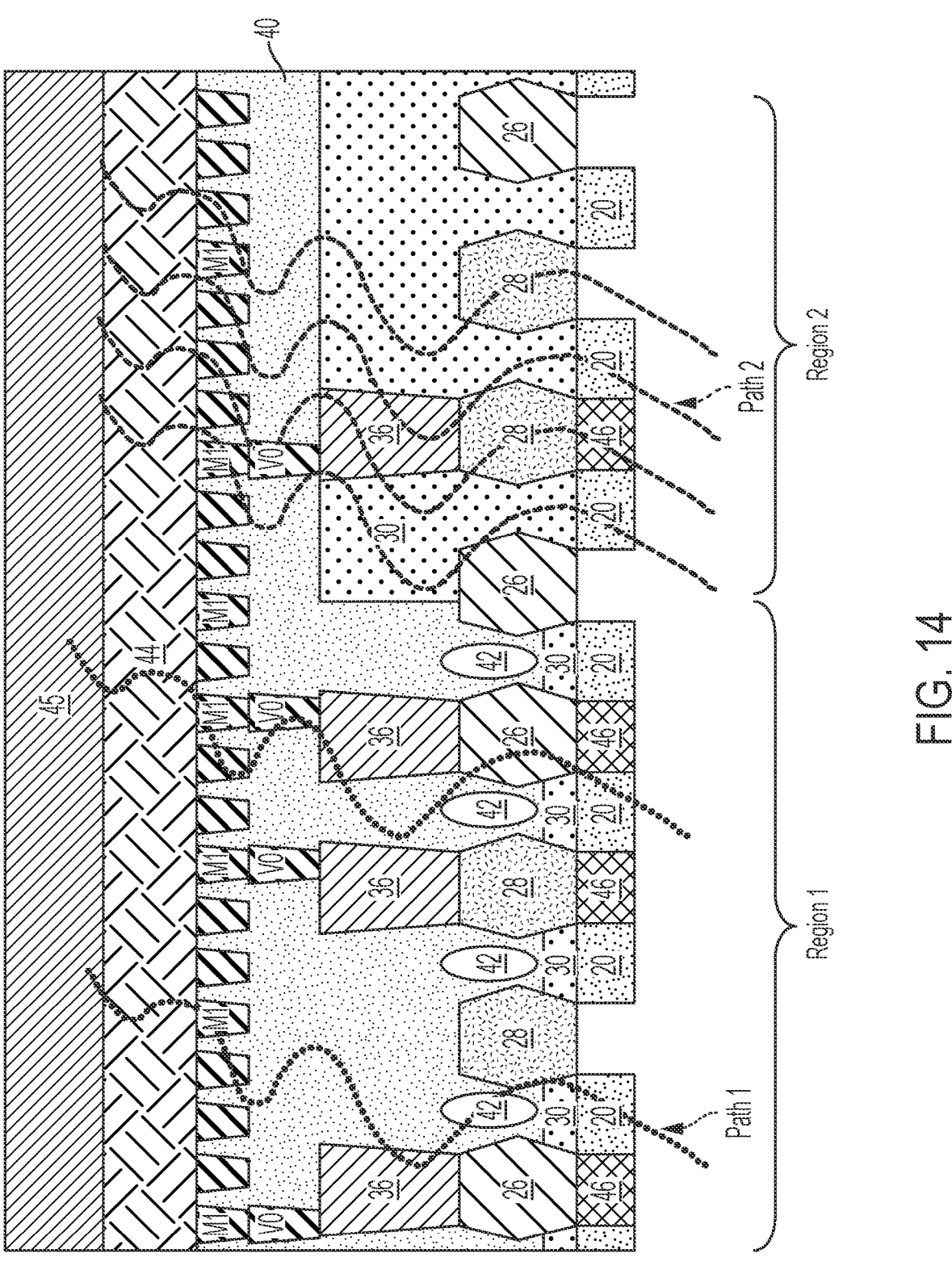
FIG. 14 is a cross sectional view of the exemplary semiconductor structure shown in FIG. 13 during backside dopant implantation and laser annealing.

Referring now to FIG. 14, there is illustrated the exemplary semiconductor structure shown in FIG. 13 during backside dopant implantation and laser annealing (or another thermal event). The backside dopant implantation includes any implantation process in which appropriate conductivity type dopants or ions (n-type or p-type) are re-introduced into each of the source/drain regions. After backside dopant implantation, laser annealing is applied to the backside of the structure to diffuse and activate the implanted dopants or ions. The laser anneal is typically performed at a temperature of 100° C. or above for a few (about 1 to 5) nanoseconds. During the laser annealing step, the heat that is generated can dissipate from the backside of the structure to the frontside of the structure and can negatively impact (resistance degradation) the electrically conductive metal lines M1. More specifically, the resistance of the electrically conductive metal lines M1 can increase as a result of the heat conducted during the annealing step. Such an increase in resistance negatively effects the operation and performance of the structure.

In cases in which a silicon dioxide (or like dielectrics that have a high thermal conductivity as silicon dioxide) frontside ILD layer is employed in both the first and second regions mentioned above, excess heat generated during this laser annealing step can conduct through the structure, specifically into and through both the first region (critical circuit path region) and the second region (non-critical circuit path region). The excess heat conducted through the structure can cause resistance degradation of the electrically conductive metal lines M1 that are present in both the first and second regions. Such resistance degradation can be acceptable for a non-critical circuit path, but is not tolerable for a critical circuit path.

In the present application, any metal line temperature rise of/in the metal lines located in the first region, Region 1 (i.e., critical circuit path region on the left hand side of FIG. 14) resulting from the laser annealing step is substantially reduced due to the existence/presence of the second frontside ILD layer 40 (See, for example, path 1 shown in FIG. 14). Stated differently, the second frontside ILD layer 40 operates to thermally insulate the metal lines M1 in that region of the structure. As a result, and due to the presence of the second frontside ILD layer 40, the metal lines M1 located in the first region (i.e., critical path region) experience less resistance degradation thereby, decreasing the negative effects of the laser annealing step described above. In contrast, thermal dissipation (see, path 2 in FIG. 14) happens in the second region, Region 2 (i.e., the non-critical circuit path region on the right hand side of FIG. 14) containing the first frontside ILD layer 30. Such thermal dissipation in the non-critical circuit path region (i.e., Region 2 on the right hand side of FIG. 14) causes the metal lines M1 in that region to experience a degradation in resistance. Unlike the first region (i.e., critical circuit path region on the left hand side of FIG. 14), there is no concern in regard to resistance degradation of the metal lines M1 that are present in the second region since those metal lines are in the non-critical circuit path region. Indeed, the second region can be used in the present application to conduct heat that is generated during the laser annealing step.

Figure 15:
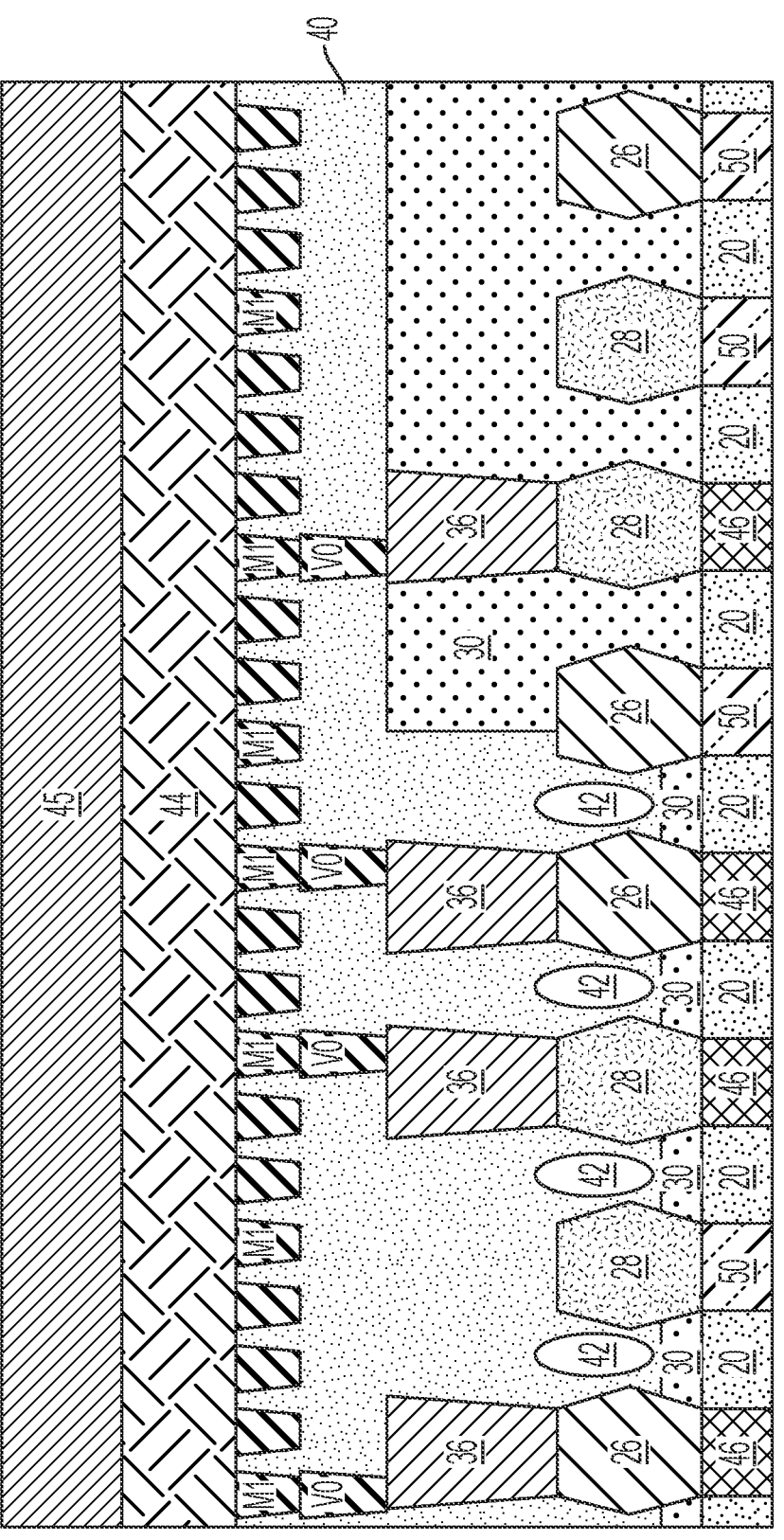
FIG. 15 is a cross sectional view of the exemplary semiconductor structure shown in FIG. 14 after performing both the backside dopant implantation and the laser annealing, and forming backside source/drain contact structures.

Referring now to FIG. 15, there are illustrated the exemplary semiconductor structure shown in FIG. 14 after performing both the backside dopant implantation and the laser annealing, and forming backside source/drain contact structures 50. The backside source/drain contact structures 50 are formed in each of the backside source/drain contact openings 48. The backside source/drain contact structures 50 are formed in direct physical contact with the revealed bottom surface of the first source/drain regions 26 and the second source/drain regions 28. The forming of the backside source/drain contact structures 50 includes filling (including deposition and planarization) the backside source/drain contact openings 48 with at least a contact conductor material which can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The backside source/drain contact structures 50 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

Referring now to FIG. 16, there is illustrated the exemplary semiconductor structure shown in FIG. 15 after forming backside power rails 54, and forming a backside interconnect structure 56. The backside power rails 54 are embedded in a second backside ILD layer 52. The second backside ILD layer 52 can be formed of one of the ILD materials mentioned above for the first backside ILD layer 46, and the second backside ILD layer 52 can be formed by utilizing one of the deposition processes mentioned above for forming the first backside ILD layer 46. The ILD material that provides the second backside ILD layer 52 can be compositionally the same as, or compositionally different from, the ILD material that provides the first backside ILD layer 46.

The backside power rails 54 are composed of any electrically conductive power rail material including, but not limited to, tungsten (W), cobalt (Co), ruthenium (Ru), aluminum (Al), copper (Cu), platinum (Pt), rhodium (Rh), or palladium (Pd). A diffusion barrier, not shown, can be present on at least the sidewalls of the backside power rails 54. The backside power rails 54 can be formed utilizing a damascene process in which openings are formed previously formed second backside ILD layer 52 and those openings are then filled with at least one of the electrically conductive power rail materials mentioned above. The filling of the openings can include a deposition process such as, for example, CVD, PECVD, ALD, sputtering or plating. A planarization process can follow the deposition process. In other embodiments, a substrative etching process can be used in which backside power rails 54 are first formed by deposition of a layer of an electrically conductive power rail material, followed by patterning the deposited layer of electrically conductive power rail material into the backside power rails 54. The second backside ILD layer 52 can then be formed to embed the backside power rails 54.

The backside interconnect structure 56 is then formed in contact with the additional backside ILD layer that includes the backside power rails 54. The backside interconnect structure 56 can be used in the present application as backside power distribution network (BSPDN). The backside interconnect structure 56 includes ILD layers having backside metal wires (the metal wires can be composed of any electrically conductive metal or electrically conductive metal alloy) embedded therein In the present application, backside interconnect structure 56 is electrically connected backside power rails 54.

It is noted that although the present application describes and illustrates forming the first frontside ILD layer 30 prior to forming the second frontside ILD layer 40, reversing the order of forming these two frontside ILD layers is possible.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first region comprising a first pair of complementary transistors;
a second region adjacent to the first region, wherein the second region comprises a second pair of complementary transistors;
a first frontside interlayer dielectric (ILD) layer having a first thermal conductivity present in the second region; and
a second frontside ILD layer having a second thermal conductivity present in the first region and in the second region, wherein the second thermal conductivity is less than the first thermal conductivity.

2. The semiconductor structure of claim 1, wherein the first region defines a critical circuit path, and the second region defines a non-critical circuit path.

3. The semiconductor structure of claim 1, wherein the second frontside ILD layer that is present in the second region is located on top of the first frontside ILD layer.

4. The semiconductor structure of claim 3, wherein a portion of the first frontside ILD layer is present in the first region beneath the second frontside ILD layer and adjacent to a neighboring pair of source/drain regions of the first pair of complementary transistors.

5. The semiconductor structure of claim 3, further comprising an air gap in the second frontside ILD layer that is present in the first region, wherein the air gap is adjacent to a neighboring pair of source/drain regions of the first pair of complementary transistors.

6. The semiconductor structure of claim 5, wherein a portion of the first frontside ILD layer is in the first region beneath the second frontside ILD layer and the air gap.

7. The semiconductor structure of claim 1, further comprising metal lines in both the first region and the second region.

8. The semiconductor structure of claim 7, wherein each metal line present in the first region has a higher line resistance than each metal line present in the second region.

9. The semiconductor structure of claim 8, further comprising a frontside back-end-of-the-line (BEOL) structure contacting each of the metal lines present in the first region and the second region.

10. The semiconductor structure of claim 9, wherein at least one of the metal lines in the first region is electrically connected to a source/drain region of a first transistor of the first pair of complementary transistors through an electrically conductive via and a frontside source/drain contact structure.

11. The semiconductor structure of claim 10, wherein the electrically conductive via and the frontside source/drain contact structure are both embedded in the second frontside ILD layer.

12. The semiconductor structure of claim 10, further comprising a backside power rail located beneath the first region, wherein the backside power rail is electrically connected to a source/drain region of a second transistor of the first pair of complementary transistors via a backside source/drain contact structure.

13. The semiconductor structure of claim 12, further comprising a backside interconnect structure contacting the backside power rail.

14. The semiconductor structure of claim 11, wherein at least one other metal line in the first region is electrically connected to a source/drain region of a second transistor of the first pair of complementary transistors through another electrically conductive via and another frontside source/drain contact structure.

15. The semiconductor structure of claim 7, wherein at least one of the metal lines in the second region is electrically connected to a source/drain region of a first transistor of the second pair of complementary transistors through an electrically conductive via and a frontside source/drain contact structure.

16. The semiconductor structure of claim 15, wherein the frontside source/drain contact structure is embedded in the first frontside ILD layer and the electrically conductive via is embedded in the second frontside ILD layer.

17. The semiconductor structure of claim 15, further comprising a backside power rail located beneath the second region, wherein the backside power rail is electrically connected to a source/drain region of a second transistor of the second pair of complementary transistors via a backside source/drain contact structure.

18. The semiconductor structure of claim 17, further comprising a backside interconnect structure contacting the backside power rail.

19. The semiconductor structure of claim 10, further comprising a pair of backside power rails located beneath the second region, wherein one of backside power rail of the pair of electrically conductive power rails is electrically connected to a source/drain region of a first transistor of the second pair of complementary transistors via a backside source/drain contact structure and the other of the backside power rails of the pair of electrically conductive power rails is electrically connected to a source/drain region of a second transistor of the second pair of complementary transistors via another backside source/drain contact structure.

20. The semiconductor structure of claim 1, wherein the first thermal conductivity of the first frontside ILD layer is 1 W/(m*K) or greater, and the second thermal conductivity of the second frontside ILD layer is less than 0.3 W/(m*K).

* * * * *